(12) United States Patent
Johnson

(10) Patent No.: US 6,958,930 B2
(45) Date of Patent: *Oct. 25, 2005

(54) MAGNETOELECTRONIC DEVICE WITH VARIABLE MAGNETIC WRITE FIELD

(76) Inventor: Mark B. Johnson, 9702 Tree Hollow Ct., Fairfax Station, VA (US) 22039

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 208 days.

(21) Appl. No.: 10/853,792

(22) Filed: May 24, 2004

(65) Prior Publication Data

US 2004/0213042 A1 Oct. 28, 2004

Related U.S. Application Data

(63) Continuation of application No. 10/100,210, filed on Mar. 18, 2002, now Pat. No. 6,741,494, which is a continuation of application No. 09/532,706, filed on Mar. 22, 2000, now Pat. No. 6,388,916, which is a division of application No. 08/806,028, filed on Feb. 24, 1997, now Pat. No. 6,064,083, which is a continuation-in-part of application No. 08/643,805, filed on May 6, 1996, now Pat. No. 5,652,445, which is a continuation-in-part of application No. 08/493,815, filed on Jun. 22, 1995, now Pat. No. 5,565,695, said application No. 08/806,028, filed on Feb. 24, 1997, is a continuation-in-part of application No. 08/425,884, filed on Apr. 21, 1995, now Pat. No. 5,629,549, and a continuation-in-part of application No. 08/643,804, filed on May 6, 1996, now Pat. No. 5,654,566.

(51) Int. Cl.$^7$ .............................................. G11C 11/00

(52) U.S. Cl. .................... 365/158; 365/170; 257/295
(58) Field of Search ................................. 365/158, 170, 365/171, 173, 9, 66, 145; 257/295, 421, 427

(56) References Cited

U.S. PATENT DOCUMENTS

| 3,650,581 A | 3/1972 | Boden et al. |
| 4,314,349 A | 2/1982 | Batcher |

(Continued)

OTHER PUBLICATIONS

R. Meservey, P. M. Tedrow and P. Fulde, Phys. Rev. Lett. 25, 1270 (1970).

P.M. Tedrow and R. Meservey, Phys. Rev. Lett. 26, 192 (1971).

(Continued)

Primary Examiner—Gene N. Auduong
(74) Attorney, Agent, or Firm—J. Nicholas Gross

(57) ABSTRACT

A new magnetic spin device can be used as a memory element or logic gate, such as an OR, AND, NOT, NOR and NAND gate. The state of the magnetic spin device is set inductively. A magnetic spin transistor/gate can be operated with current gain. Furthermore, inductive coupling permits the linking of multiple spin transistors and spin transistor gates to perform combinational tasks. A half adder embodiment is specifically described, and other logic gates and combinations of half adders can be constructed to perform arithmetic functions as part of a microprocessor.

20 Claims, 12 Drawing Sheets

U.S. PATENT DOCUMENTS

| | | | |
|---|---|---|---|
| 4,360,899 A | | 11/1982 | Dimyan et al. |
| 4,607,271 A | | 8/1986 | Popovic et al. |
| 4,663,607 A | | 5/1987 | Kitada et al. |
| 4,700,211 A | | 10/1987 | Popovic et al. |
| 4,780,848 A | | 10/1988 | Daughton et al. |
| 4,896,296 A | | 1/1990 | Turner et al. |
| 4,905,178 A | | 2/1990 | Mor et al. |
| 5,089,991 A | | 2/1992 | Matthews |
| 5,173,873 A | | 12/1992 | Wu et al. |
| 5,237,529 A | | 8/1993 | Spitzer |
| 5,239,504 A | | 8/1993 | Brady et al. |
| 5,245,226 A | | 9/1993 | Hood et al. |
| 5,245,227 A | | 9/1993 | Furtek et al. |
| 5,251,170 A | | 10/1993 | Daughton et al. |
| 5,289,410 A | * | 2/1994 | Katti et al. ............... 365/170 |
| 5,329,480 A | | 7/1994 | Wu et al. |
| 5,329,486 A | | 7/1994 | Lage |
| 5,396,455 A | * | 3/1995 | Brady et al. ................ 365/97 |
| 5,420,819 A | | 5/1995 | Pohm |
| 5,424,236 A | | 6/1995 | Daughton et al. |
| 5,432,373 A | * | 7/1995 | Johnson ..................... 257/421 |
| 5,452,163 A | | 9/1995 | Coffey et al. |
| 5,475,277 A | | 12/1995 | Johnson |
| 5,488,250 A | | 1/1996 | Hennig |
| 5,491,338 A | | 2/1996 | Spitzer |
| 5,565,695 A | * | 10/1996 | Johnson ..................... 257/421 |
| 5,580,814 A | | 12/1996 | Larson |
| 5,594,366 A | | 1/1997 | Khong et al. |
| 5,621,338 A | | 4/1997 | Liu et al. |
| 5,629,549 A | * | 5/1997 | Johnson ..................... 257/421 |
| 5,629,922 A | | 5/1997 | Moodera et al. |
| 5,640,343 A | | 6/1997 | Gallagher et al. |
| 5,652,445 A | * | 7/1997 | Johnson ..................... 257/421 |
| 5,652,875 A | | 7/1997 | Taylor |
| 5,654,566 A | * | 8/1997 | Johnson ..................... 257/295 |
| 5,926,414 A | * | 7/1999 | McDowell et al. ......... 365/170 |
| 5,998,040 A | | 12/1999 | Nakatani et al. |
| 6,064,083 A | * | 5/2000 | Johnson ..................... 257/295 |
| 6,178,112 B1 | * | 1/2001 | Bessho et al. .............. 365/173 |
| 6,205,008 B1 | | 3/2001 | Gijs et al. |
| 6,342,713 B1 | * | 1/2002 | Johnson ..................... 365/170 |
| 6,381,170 B1 | | 4/2002 | Prinz |
| 6,388,916 B1 | | 5/2002 | Johnson |
| 6,741,494 B2 | * | 5/2004 | Johnson ..................... 365/158 |
| 6,753,562 B1 | * | 6/2004 | Hsu et al. .................... 257/295 |

OTHER PUBLICATIONS

Paul Horowitz and Winfield Hill, *The Art of Electronics*, Cambridge Univ. Press, Cambridge U.K. (1980); see p. 328.

Mark Johnson and R. H. Silsbee, *Interfacial Charge–Spin Coupling; Injection and Detection of Spin Magnetization in Metals*, Phys. Rev. Lett. 55, 1790 (1985). (4 pages).

Mark Johnson and R. H. Silsbee, *A Thermodynamic Analysis of Interfacial Transport and of the Thermomagnetoelectric System*, Phys. Rev. B 35, 4959 (1987). (14 pages).

P. C. van Son, H. van Kampen and P. Wyder, Phys. Rev. Lett. 58, 2271 (1987). (3 pages).

Mark Johnson and R. H. Silsbee, *Ferromagnet–NonFerromagnet Interface Resistance*, Phys. Rev. Lett. 60, 377 (1988).

Mark Johnson and R. H. Silsbee, *Coupling of Electronic Charge and Spin at a Ferromagnetic –Paramagnetic Metal Interface*, Phys. Rev. B 37, 5312 (1988). (14 pages).

Mark Johnson and R. H. Silsbee, *The Spin Injection Experiment*, Phys. Rev. B 37, 5326 (1988). (10 pages).

Mark Johnson and H. Silsbee, *Electron Spin Injection and Detection at a Ferromagnetic–Paramagnetic Interface*, J. Appl. Phys. 63, 3934 (1988). (6 pages).

P.C. van Son, H. van Kampen and P. Wyder, Phys. Rev. Lett. 60, 378 (1988).

R. S. Popovic, *Hall–effect Devices*, Sens. Actuators 17, 39 (1989).

James Daughton, *Magnetoresistive Memory Technology*, Thin Solid Films 216, 162 (1992). (7 pages).

J. De Boeck, J. Harbison et al., *Non–volatile Memory Charateristics of Submicrometer Hall Structures Fabricated in Epitaxial Ferromagnetic MnAl Films on GaAs*, Electronics Letters 29, 421 (1993). (3 pages).

Mark Johnson, *Spin Accumulation in Gold Films*, Phys. Rev. Lett. 70, 2142 (1993). (4 pages).

Mark Johnson, *Bipolar Spin Switch*, Science 260, 320 (1993). (4 pages).

Mark Johnson, *Bilayer Embodiment of the Bipolar Spin Switch*, Appl. Phys. Lett. 63, 1435 (1993). (3 pages).

Mark Johnson, *The All–Metal Spin Transistor*, I.E.E.E. Spectrum Magazine 31 No. 5, 47 (1994). (5 pages).

Mark Johnson, *Spin Polarization of Gold Films via Transport*, J. Appl. Phys. 75, 6714 (1994). (6 pages).

Mark Johnson, *Spin–Coupled Resistance Observed in Ferromagnet–Superconductor–Ferromagnet Trilayers*, Appl. Phys. Lett., Sep. 12, 1994.

Mark Johnson, *The Bipolar Spin Transistor*, I.E.E.E. Potentials 14, 26 (1995).

S. T. Chui and J. R. Cullen, *Spin Transmission in Metallic Trilayers*, Phys. Rev. Lett. 74, 2118 (1995). (4 pages).

* cited by examiner

MAGNETOELECTRONIC DEVICE WITH VARIABLE MAGNETIC WRITE FIELD

RELATED APPLICATION DATA

The present invention claims priority to and is a continuation of application Ser. No. 10/100,210 filed Mar. 18, 2002, now U.S. Pat. No. 6,741,494, entitled "Magnetoelectronic Memory Element With Inductively Coupled Write Wires." Application Ser. No. 10/100,210 is a continuation of an application Ser. No. 09/532,706 filed Mar. 22, 2000 titled "Magnetoelectronic Memory Element With Isolation Element" (now U.S. Pat. No. 6,388,916). The latter application Ser. No. 09/532,076 is in turn a divisional application of Ser. No. 08/806,028 filed Feb. 24, 1997 entitled "Hybrid Hall Effect Memory Device & Method of Operation," now U.S. Pat. No. 6,064,083. Ser. No. 08/806,028 is a continuation-in-part of Ser. No. 08/643,805, filed May 6, 1996 titled "Hybrid Hall Effect Device and Method of Operation," (now U.S. Pat. No. 5,652,445), which in turn is a continuation-in-part of an application Ser. No. 08/493,815, filed Jun. 22, 1995 titled "Magnetic Spin Transistor Hybrid Circuit Element," (now U.S. Pat. No. 5,565,695); and said Ser. No. 08/806,028 is also a continuation-in-part of an application Ser. No. 08/425,884, filed Apr. 21, 1995 titled "Magnetic Spin Transistor, Logic Gate & Method of Operation," (now U.S. Pat. No. 5,629,549); and an application Ser. No. 08/643,804 filed May 6, 1996 titled "Magnetic Spin Injected Field Effect Transistor and Method of Operation," (now U.S. Pat. No. 5,654,566).

The above applications and materials are expressly incorporated by reference herein.

FIELD OF THE INVENTION

The invention relates generally to ferromagnetic electronic devices. In particular, the invention relates to a Magnetoelectronic device which is responds to variable magnetic write fields for memory, logic, and other functional applications.

BACKGROUND OF THE INVENTION

Typical contemporary digital electronic circuits are based primarily on transistor devices fabricated from semiconductor materials. In fact, the development of microfabricated bipolar and field effect transistors led directly to the modern development of digital electronic circuits and microprocessors [see texts by Horowitz and Hill, "The Art of Electronics"; D. V. Bugg, "Circuits, Amplifiers and Gates"]. Digital electronics refers to circuits in which there are only two states possible at any point. Typically these states are set by gate circuits comprised of one or more interconnected microfabricated semiconductor transistors that can be in one of two stable states: saturation or nonconducting. Because the gates have characteristically high impedance, these semiconductor transistors (and circuits) use electrodynamic input and output in the form of digital voltage pulses. These semiconductor transistors and circuits are directly electrically connected together by some conductive material. The voltage states corresponding to saturation and nonconducting are HIGH and LOW, which represent, respectively, the TRUE and FALSE states of Boolean logic. These states also correspond to bits of information, typically HIGH represents a "1" and LOW a "0."

The class of tasks in which the output or outputs are predetermined functions of the input or inputs is called "combinational" tasks. These tasks can be performed by semiconductor transistor gates which perform the operations of Boolean algebra applied to two-state systems. Combinational logic is basic to digital electronics. The three most popular semiconductor transistor logic families presently in use are Transistor-Transistor logic (TTL), Metal Oxide Semiconductor (MOS) logic and Complimentary MOS (CMOS) logic.

A disadvantage of such semiconductor transistors is the fact that their size and packing density is limited by the inherent physics of their operation, including thermal restrictions and density of charge carriers. Moreover, to implement the logic of even a simple single logic gate (such as an AND gate for example) in semiconductor digital electronics usually requires a circuit composed of several transistors [and possibly resistors and diodes] which takes up further space. Finally, to make semiconductor devices that are non-volatile—i.e., to retain a particular logical state—typically requires complex device logic support structures and/or operational characteristics.

The above considerations, and others well known in the art, restrict the packing density of semiconductor devices. Recently, a new magnetic spin transistor has been developed which can perform substantially all of the operations associated with semiconductor transistors. This new transistor, including its structure and operation, is described in detail in articles authored by me and appearing in IEEE Potentials 14, 26 (1995), IEEE Spectrum Magazine 31 no. 5, pp. 47–54 (May 1994), Science, 260 pp. 320–323 (April 1993), all of which are hereby incorporated by reference.

The structure, however, of this new magnetic spin transistor has prevented it use as a logic gate for performing digital combinational tasks. To date in fact, such magnetic spin transistors have been limited to such environments as memory elements, or magnetic field sensors.

Moreover, a major problem to date has been the fact that there has been no feasible or practical way to interconnect one or more spin transistors together. This is because, unlike semiconductor transistors, spin transistors are low impedance, current biased devices, which cannot be directly electrically interconnected from one to another by using electrodynamic coupling and the transmission of voltage pulses.

Finally, another problem with previously known magnetic spin transistors is the fact the output current of such devices has not been large enough to accomplish current gain. Lack of current gain is another reason why contemporary magnetic spin transistors cannot be successfully interconnected together to form digital processing circuits, because the output of one device must be capable of setting the state of another device, a condition that can be stated as requiring that device fanout must be greater than one.

SUMMARY OF THE INVENTION

An object of the present invention therefore is to provide an improved magnetic spin transistor that can be used as a logic gate for performing digital combinational tasks, as well as in all other environments (including memory applications).

Another object of the present invention is to provide a new structure and method for interconnecting one or more spin transistors together.

A related object of the present invention is to provide a new structure for a magnetic spin transistor processing circuit having logically interconnected elements.

A further object of the present invention is to provide an improved magnetic spin transistor which has current gain, and therefore is capable of setting the state of another spin transistor device.

According to the present invention, an improved magnetic spin transistor (having two ferromagnetic layers and a paramagnetic layer) is fabricated with ferromagnetic and nonmagnetic materials and may be fabricated entirely from metals. This magnetic spin transistor is provided having a conductive write layer for carrying a write electric current and inductively coupling a write magnetic field associated with this write current to the second (collector) ferromagnetic layer of the spin transistor. The first (emitter) and second (collector) ferromagnetic layers of this new transistor are both fabricated to be magnetically anisotropic so as to permit the collector to have two stable magnetization states (up and down). An external current generator can change the magnetization state of the collector by inductively coupling a magnetic field to the collector.

Even if power is removed from the above device, the second ferromagnetic layer magnetization orientation is retained in its set state, thus causing the spin transistor to behave as a non-volatile memory element, because the two states of the magnetization orientation of said second ferromagnetic layer can correspond to data values stored in said memory element. An array of spin transistors can be coupled together in an array to form a spin transistor memory array. The present magnetic spin transistor therefore will find application as the basic storage element in integrated arrays of nonvolatile random access memories (NRAM), and may replace DRAM and direct access memory (such as magnetic disk drives) in many applications.

Further according to the present invention, a spin transistor logic gate can be fabricated using the above improved spin transistor. This gate can implement any desired combinational task (function) relating one or more inputs to said spin transistor to an output of the spin transistor. Depending on the particular function to be implemented, the state of the gate (the initial magnetization state of the collector) is first set using a magnetic field generated by a current pulse transmitted through a write wire inductively coupled to the gate (the ferromagnetic collector of the spin transistor). This same wire also inductively couples a magnetic field generated by the combined current of one or more input data signals to the spin transistor. Again, depending on the particular function to be implemented the ferromagnetic collector magnetization can be configured (in combination with the current level associated with the input data signals and the coupling of the wire carrying this current with the ferromagnetic collector) to change or remain the same depending on the particular combination of input data signals. In other words, the ferromagnetic collector magnetization may be read out as an output binary "1" or "0" corresponding to some Boolean logical combination task depending on the data input signals. In any specific embodiment, therefore, the present invention can be configured to implement the function of any of the following gates: an OR gate, a NOR gate, a NOT gate, a NAND gate, an AND gate, or more generally any logic gate implementing a logical combinational task relating one or of inputs/outputs.

The present magnetic spin transistor logic gate invention is a substantial improvement over prior semiconductor gates using semiconductor transistors. Among other things, a unique dynamically programmable logic gate is provided by the present invention. This is because the initial magnetization of the ferromagnetic collector, the amplitude of the input signal currents on the write wire, and/or the coupling of the input signal current to the spin transistor can all be controlled and changed dynamically to configure the spin transistor logic gate to implement a different logical function. Furthermore, whereas a single logic gate in semiconductor digital electronics is itself a circuit composed of several transistors [and possibly resistors and diodes], the spin transistor logic gate is composed of a single spin transistor element.

In accordance with another embodiment, the present magnetic spin transistor invention can also be constructed so that the output current is larger than the write current, thus operating [albeit in a nonconventional sense] with current gain. Unlike prior spin transistor embodiments, the parasitic impedance, transimpedance and load impedance (which impedances are explained more fully below) of the present invention can be designed and implemented so as to permit any form of spin transistor output (i.e., current or voltage) having any desired offset.

According to another aspect of the present invention, a magnetic spin transistor can now be operatively connected to another spin transistor device by inductively coupling the output current pulse of one spin transistor to the input of another transistor. Using this method, several gates can also be linked together by coupling the output of one gate to the write line of another gate.

In this way, an arrangement of gates can be assembled to operate as a half adder, which is the basic functional unit of digital processing; half adders can be joined together to perform all the usual mathematic functions. Combined with the memory functions of spin transistors, the additional capability of amplifying current and performing combinational tasks means that entire microprocessors can be fabricated entirely from spin transistor components, using no semiconductor devices.

The advantages of magnetic spin transistors over semiconductor transistors are significant. First, magnetic spin transistors can be fabricated entirely from metals, and thus are not susceptible to the thermal restrictions on packing density, nor on the intrinsic restriction imposed by the density of charge carriers, that affect semiconductor devices. For these reasons, spin transistors and logic gates made from such transistors may be fabricated on a scale much smaller than semiconductor processors, and higher densities may be achieved.

It is further expected that such spin transistors will draw less power than their semiconductor equivalents, and have a further advantage that they will not need require synchronization to a clock. Finally, spin transistors and circuits incorporating such transistors have the inherent advantage of non-volatility because the magnetization state or result of the logical step is automatically stored in the gate for indefinite time [drawing zero quiescent power] and is available for readout whenever it is needed.

DETAILED DESCRIPTION OF THE INVENTION

Before explaining the details of the new magnetic spin transistor, or its implementation as a logic gate or in other environments, a brief review of the operating principles and device characteristics of the spin transistor will be provided for purposes of putting the present invention in context. While specific details of the physics of these devices is not important for purposes of the present invention, a more detailed discussion can be found in the aforementioned Science and IEEE Spectrum articles.

Figure 1:
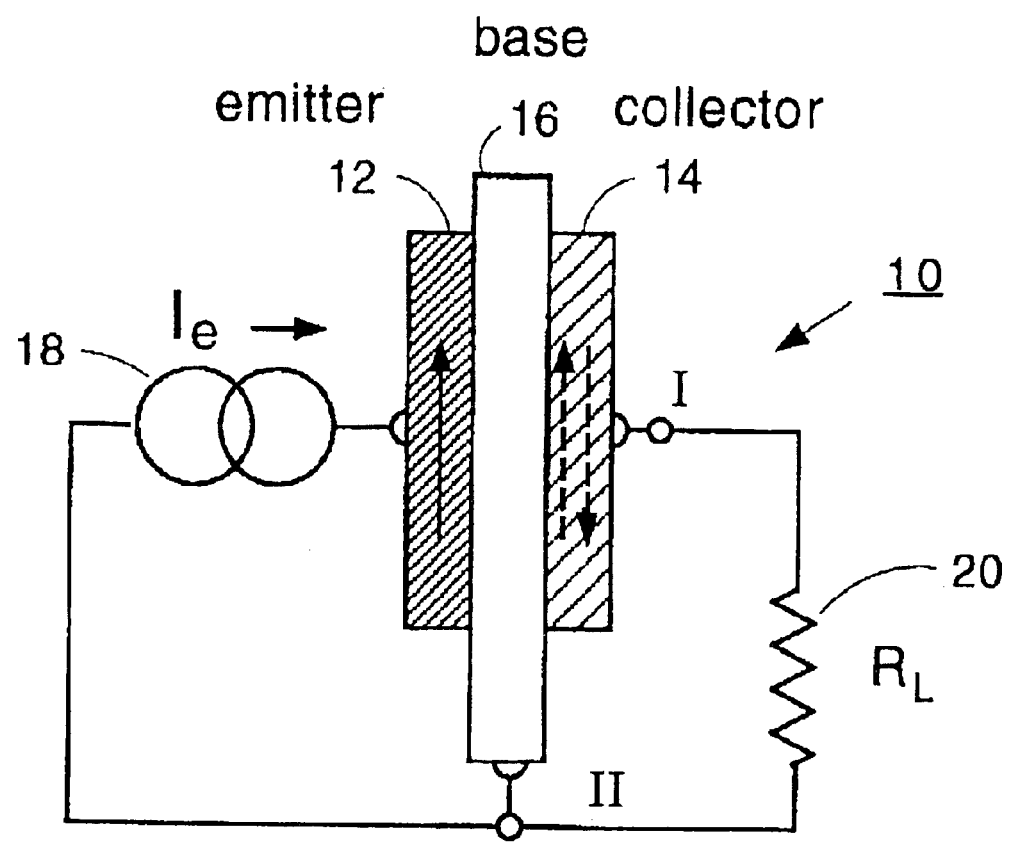
FIG. 1 is a cross-sectional view of a trilayer structure illustrating the basic structure and operation of a typical magnetic spin transistor.

Most embodiments rely on a trilayer structure drawn schematically in cross-section in FIG. 1. Ferromagnetic emitter 12 and ferromagnetic collector 14 are thin films of iron, cobalt or permalloy $Ni_xFe_{1-x}$, although any electrically conductive, single domain ferromagnetic layers may be used. Paramagnetic base 16 is gold, copper, or aluminum, but any conductive paramagnetic material, i.e. any material having electron levels that are not significantly affected by the electron spin so that there is little splitting between the spin subbands is acceptable. The equilibrium energy levels for typical paramagnetic materials are substantially the same for the two electronic spins. Alternatively, a nonparamagnetic material that can be made paramagnetic through known means is also acceptable.

It will be understood by skilled artisans that the terms "ferromagnetic emitter," "paramagnetic base" and "ferromagnetic collector" serve as short hand descriptive aids in this field for understanding the present invention. In same ways, these terms suggest a natural analogy with semiconductor devices. While such analogies may be helpful pedagogical notions, no limitations or relationships typically associated with or between such structures in the physics of semiconductor transistors should be presumed to apply to the corresponding ferromagnetic and paramagnetic regions of the present invention. A full understanding of the limitations and relationships of such regions in the present invention is provided herein, in the above articles, and in other prior art materials discussing magnetic spin transistors.

Each of the three films typically has a thickness greater than an electron mean free path, typically tens to hundreds of nanometers. The thickness of the paramagnetic base 16 is preferably less than the spin diffusion length $\delta_s$, typically of order 1 micron in polycrystalline metal films such as gold, copper, silver, aluminum or niobium, and defined to be the length l in the paramagnetic base over which a induced nonequilibrium magnetization M_ diffuses while the amplitude diminishes to 1/e of the initial value, $M\_ = M\_o\ e^{-1/\delta}$.

In general the orientation of the magnetizations of the ferromagnetic emitter 12 and ferromagnetic collector 14, $M_E$ and $M_C$, can lie in any direction. It is common to use ferromagnetic materials with in-plane anisotropies so that $M_E$ and $M_C$ are restricted to lie in the plane of the films, in which case the device has a continuum of states with each state corresponding to the projection of the magnetization of $M_C$ on $M_E$. For digital applications, the device is preferably fabricated using ferromagnetic films with parallel anisotropy axes in the film plane. The ferromagnetic emitter 12 is fabricated from a material with a large coercivity [and/or a large exchange bias or pinning anisotropy] and the ferromagnetic collector 14 is fabricated from a material with a smaller coercivity. Thus, $M_E$ is initially polled in the up orientation, denoted in FIG. 1 by the up arrow within the ferromagnetic emitter 12, and it remains in this state. Under these conditions a spin transistor acts as a two state device, corresponding to the two stable states of $M_C$, up and down (parallel or antiparallel to $M_E$). These two equally likely states are represented in FIG. 1 by the dashed arrows, up and down, within the ferromagnetic collector 14. For the chosen convention of $M_E$ up, the two device states are determined by the state of $M_C$ and are hereafter labeled as "up" and "down." Those skilled in the art will appreciate that $M_E$ could be chosen down and a two state device would exist with opposite output polarity; moreover, an equivalent notation, sometimes used in the literature, is $M_E$ and $M_C$ parallel or antiparallel.

A conventional spin transistor such as shown in FIG. 1 is a three terminal, current biased, low impedance device with a bipolar voltage or current output that depends on the state of the device [i.e. that depends on the projection of $M_C$ on $M_E$]. An electrical source 18 pumps positive bias current $I_E$ from the ferromagnetic emitter 12 to the paramagnetic base 16 and creates a nonequilibrium population of spin polarized electrons, equivalently a nonequilibrium magnetization M_ in the paramagnetic base. In the simplest analysis, much of the bias current returns to the source by the path through node II. The nonequilibrium magnetization in the paramagnetic base generates an electric field at the paramagnetic base-ferromagnetic collector interface, and the sign of the field depends on the magnetization orientation of the ferromagnetic collector $M_C$ with respect to the orientation of the polarized electrons, and therefore with respect to $M_E$. When $M_E$ and $M_C$ are parallel the electric field generated at the interface pushes electric current from the paramagnetic base into the ferromagnetic collector, and when they are antiparallel the field pulls electric current from the ferromagnetic collector into the paramagnetic base.

Since current in the circuit of FIG. 1 is conserved, the interfacial electric field can be considered as a "battery" that generates a circulating current in the ferromagnetic collector arm of the circuit, either clockwise or counter-clockwise. Quantitatively, the interfacial electric field that is generated by the nonequilibrium population of polarized spins can be described by a transimpedance $R_S$. The spin-coupled voltage $V_S$ developed across the interface is linearly proportional to bias current, $R_S = |V_S|/I_E$, where $R_S$ is defined as positive and $V_S$ is bipolar. The magnitude of $R_S$ is inversely proportional to the volume of the paramagnetic conducting material (the paramagnetic base) between the ferromagnetic emitter and ferromagnetic collector, and can be of the order of ohms for devices fabricated with a spatial scale on the order of a micron.

In FIG. 1, the ferromagnetic collector arm of the circuit contains an arbitrary (selectable) load resistance 20, also called $R_L$. The response of the spin transistor to several loading configurations can now be discussed.

In the first extreme case let $R_L \Rightarrow 0$ so that the ferromagnetic collector arm of the circuit behaves as a short circuit ammeter. Then current flow in the ferromagnetic collector arm will be clockwise and positive, from node I through $R_L$ to node to II, when $M_C$ is up [$M_E$ and $M_C$ parallel], and counter-clockwise and negative (current will flow from II to I) when $M_C$ is down [$M_E$ and $M_C$ antiparallel].

In the second extreme case let $R_L \Rightarrow \infty$ so that the ferromagnetic collector arm of the circuit represents an open circuit voltmeter. Then the voltage $V_I$ at node I is positive with respect to the voltage at the paramagnetic base, $V_I > V_{II}$, when $M_C$ is up, and $V_I$ is negative with respect to the paramagnetic base when $M_C$ is down.

First Embodiment—Magnetic Spin Transistor With Adjustable Output Offset

Figure 2:
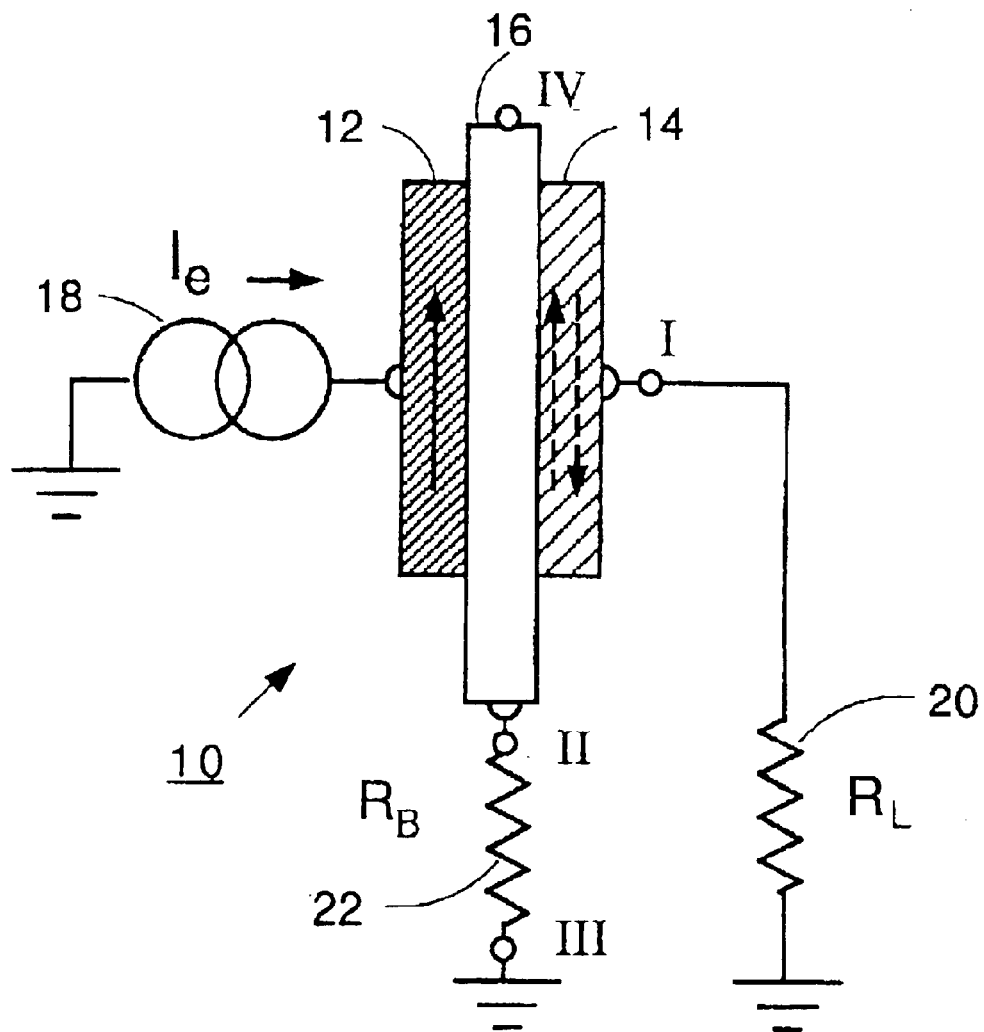
FIG. 2 is a cross-sectional view of the trilayer structure in FIG. 1 showing an embodiment of the present invention wherein circuit elements are used to offset the output current or voltage.

A first embodiment of my improved spin transistor design is shown electrically in FIG. 2. This embodiment shows changes that I have discovered more realistically model spin transistor devices as real circuit elements. First, separate grounds have been drawn for the electrical source 18, paramagnetic base 16 and ferromagnetic collector 14 to represent the fact that these components may be grounded at spatially remote parts of a circuit. Second, a parasitic resistance 22, also denoted $R_B$ has been explicitly included between the paramagnetic base and ground. This represents the fact that there is always some finite resistance from the paramagnetic base to ground including, for example, the intrinsic resistance of the paramagnetic conducting material comprising the paramagnetic base itself. In typical prior art spin transistor embodiments, $R_B$ is considered to be negligibly small or exceedingly large, and in these embodiments the output current or voltage is limited to be symmetrically bipolar.

In the present invention, $R_B$ is adjusted relative to the transimpedance $R_S$ to permit the output of a spin transistor to be offset by a desired amount to effectuate anything from a full bipolar to a unipolar output for any known load resistance $R_L$. The adjustment of $R_B$ relative to the transimpedance $R_S$ can be accomplished by altering the geometry of the paramagnetic base 16 relative to the ferromagnetic emitter 12 and ferromagnetic collector 14 regions, such as by varying the thickness and transverse dimensions of the paramagnetic conducting material outside the region between ferromagnetic emitter and ferromagnetic collector, or introducing a low transmission barrier at either interface or at any boundary to the paramagnetic base region (the region between ferromagnetic emitter and ferromagnetic collector), or by using different materials for the paramagnetic base such as niobium. In this manner, $R_B$ can be made to be on the same order, or larger than the transimpedance $R_S$.

Unlike prior spin transistor embodiments that only accommodate the extreme cases of $R_L=0$ or $\infty$, the present invention, by adjusting the above parameters, can generate a useful output for any value of $R_L$. The response of the spin transistor of the present invention in FIG. 2 to a general loading configuration $R_L$, and general value of $R_B$ can now also be discussed.

The net current flow in the ferromagnetic collector is the superposition of the circulating current driven by $V_S$ and the background, ohmic current flow resulting from the parallel combination of $R_L$ and $R_S$. It is possible, as explained above, to vary the value and ratio of $R_L$, $R_S$ and $R_B$ so that the bipolar output is offset upwards. For example, using values $R_L=R_B=R_S$ the output is offset up by an amount $R_S$. In this case, the current output through $R_L$ is positive when $M_C$ is up [$M_E$ and $M_C$ parallel], and zero when $M_C$ is down [$M_E$ and $M_C$ antiparallel]. This specific output offset is used during the following discussion of digital operation.

Second Embodiment—Magnetic Spin Transistor With Write Wire

Figure 3:
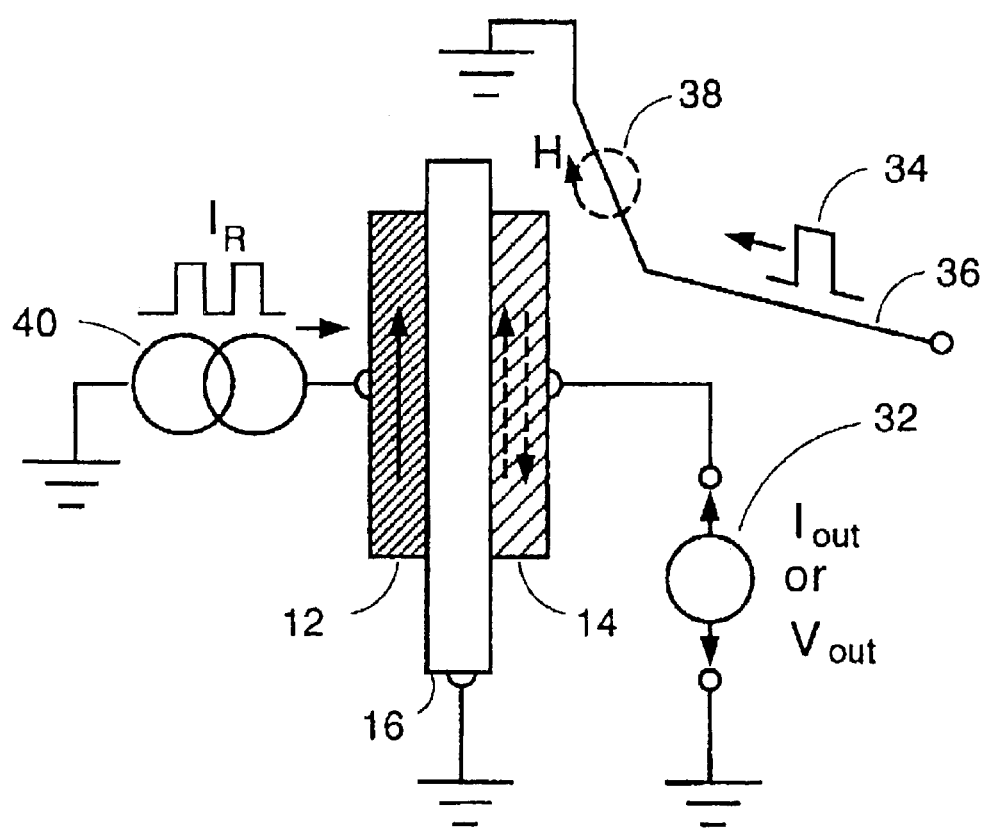
FIG. 3 is a cross-sectional view of the trilayer structure of the present basic improved magnetic spin transistor invention which is usable for any number of operating environments.

The operation of an improved spin transistor invention 10 is shown in FIG. 3. In this figure, while the spin transistor also includes adjustable offset, the parasitic paramagnetic base resistance $R_B$ has not been included in the drawing and any load resistance has been replaced by a meter [detector] 32 that displays the output current or voltage of the ferromagnetic collector arm of the circuit and has characteristic impedance $R_L$. A bias current can be applied in the form of digital pulses 40; this can also be considered as a read current $I_R$. The orientation $M_C$ of the magnetization of the ferromagnetic collector can be set to a stable state by using localized pulses of magnetic field. An integrated wire fabricated in close proximity to the ferromagnetic collector film 14 is called a write wire 36. A pulse of positive electric current 34, called a write pulse, transmitted down the write wire generates a magnetic field 38 close to the write wire. The write wire is situated so that a positive current generates a field 38 at the ferromagnetic collector that is positive (up in FIG. 3) and the magnetization orientation of $M_C$ will be set upwards in response to this field if it is of sufficient magnitude. When no current is transmitted in the write wire there is no magnetic field and the magnetization orientation $M_C$ retains its initial orientation because of hysteresis. If a sufficiently large negative current pulse is transmitted down the write wire, the associated magnetic field pulse will be negative, pointing downwards at the ferromagnetic collector, and $M_C$ will be set to point down. While element 36 in FIG. 3 has been described as a "wire" it will be understood by persons skilled in the art that any number of well-known structures capable of carrying sufficient current (including for example a conductive film, or an interconnect line) to generate field 38 will be suitable in the present invention.

Figure 3A:
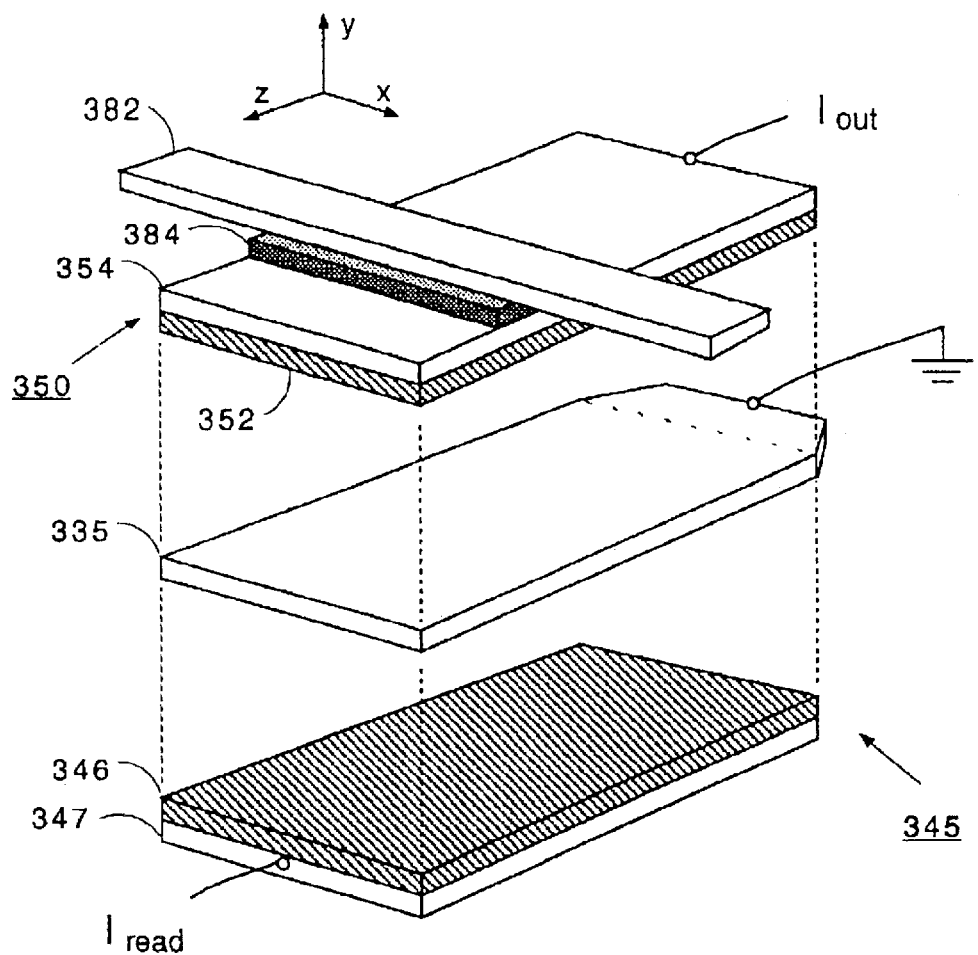
FIG. 3A is a perspective view of same trilayer structure of the present basic improved magnetic spin transistor invention, showing the paramagnetic base, ferromagnetic emitter, ferromagnetic collector and connections thereto.

The structural configuration of the preferred embodiment of the improved spin transistor 300 shown with an integrated write wire is depicted in FIG. 3A. Ferromagnetic collector electrode 350 is a bilayer composed of ferromagnetic collector 352 and a thin overlayer 354 which serves to improve current flow and to protect the ferromagnetic collector against oxidation. The ferromagnetic collector electrode 350 may be rectangular in shape and may have transverse dimensions ranging from 0.1 to 50 microns. An electrically insulating material 384 coats a portion of the electrode. Write wire 382 (typically a metal film or other strongly conducting film) is fabricated over the insulator 384 so that it is electrically isolated from the ferromagnetic collector. It is understood that this spatial orientation can be inverted with the write wire underneath; in some geometries the spin transistor element can carry some of the current of the write pulse.

In FIG. 3A only a portion of the write wire 382 is shown; the wire extends to contact a bipolar current source at one end and a ground which is preferably a ground isolated from the magnetic transistor ground on the other end.

Alternatively, write wire 382 can be connected to a single polarity source (such as a data input source that varies from 0 to some positive value). The vector magnetic field generated by current flow in the write wire 382 points in a circulating direction 386. For positive current the field at the position of the ferromagnetic collector 352 is positive along the z axis. The linear relationship between the magnitude of the field at the ferromagnetic collector 352 and the magnitude of the current in the write wire 382 is described by the inductive coupling parameter a. The field magnitude is directly proportional to the current magnitude, H=αI. As is well known in the art, a depends on the detailed geometry of the write wire 382, ferromagnetic collector electrode 350, and their spatial relationship. As such, it can be selected by a skilled designer to have any desired value. It is understood, for example, that α decreases as the thickness of the insulating layer 384 increases. In the preferred embodiments shown herein, α is chosen to have a value between 5 and 20 (in practical units where I is in amps and H in tesla).

The amplitude of the write pulse is determined so that the amplitude of the local magnetic field at the ferromagnetic collector is greater than (sufficient to overcome) the coercivity of the ferromagnetic collector and thus set the ferromagnetic collector to a different magnetization state. Again, it is well known in the art that the amplitude of the local magnetic field amplitude impressed on the ferromagnetic collector depends on the value of the inductive coupling parameter α, and the amplitude of the write current pulse. In the preferred embodiment, the write pulse has a current amplitude of 0.1 mA, and the amplitude of the local magnetic field is about 10 Oersted (α=8). The coercivity of the ferromagnetic emitter and ferromagnetic collector is selected to be 40 and 8 Oersteds respectively. The choice of specific current amplitude, field strength and coercivities to be used can be easily determined by one skilled in the art depending on the specific application desired.

In the detailed preferred embodiment shown in FIG. 3A, the ferromagnetic emitter 345 is typically a bilayer composed of a ferromagnetic conductor 346 made of iron, permalloy or cobalt (with a thickness 0.06 micron, a length of about 2 microns and a width of 1 micron) fabricated on a nonmagnetic conductor 347 which is used either to promote a magnetic anisotropy in the ferromagnetic conductor 346 (in which case the material could be nickel oxide with a thickness of 0.01 micron) or to promote isotropic current flow into the ferromagnetic emitter 345 (in which case the material would be gold, silver, aluminum or copper with a thickness of 0.08 micron). The ferromagnetic collector 250 is a bilayer composed of ferromagnetic conducting material 352 with a thickness 0.06 micron, a length of about 2 microns and a width of about 1 micron. Overlayer 354 is made of gold, silver, aluminum or copper, has a thickness of 0.08 micron, a length of 2 microns and a width of 1 micron. Write wire 382 is made of gold, silver, aluminum or copper, has a thickness of 0.1 micron and a width of 1 micron (the length extends out of the figure). Insulating layer 384 is made of polymide, aluminum oxide, silicon dioxide or silicon monoxide, has a thickness of 0.05 micron, a width of 1.2 microns and a length of 1.5 microns. The paramagnetic base 335 is made of gold, silver, copper or aluminum with a thickness of 0.1 micron, a width of 1 micron and a length of 2 microns.

As will be understood by those skilled in the art, the materials and dimensions described for the above structures are not critical within most reasonable limits. Typically, there are wide ranges of acceptable values for any particular application, and the final choice can made on the operating requirements of any chosen application for such magnetic spin transistors.

Figure 3B:
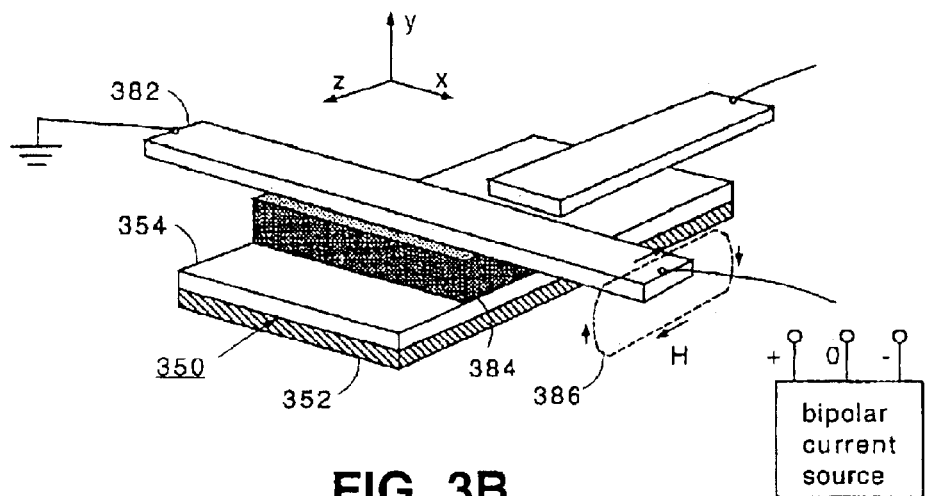
FIG. 3B is a perspective view of a write wire inductively coupled to the present improved spin transistor/spin transistor gate.
Figure 3C:
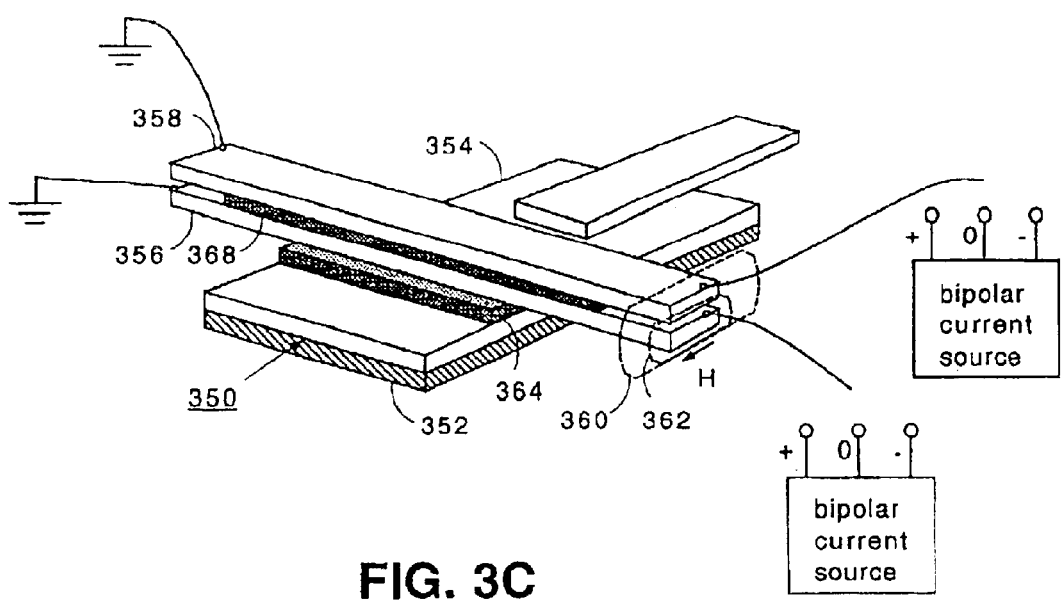
FIG. 3C is a perspective view of two write wires inductively coupled to one spin transistor element in an array of spin transistor elements.

An alternative embodiment of the present invention, depicting the improved magnetic spin transistor as a memory element 300 in a memory array is shown in FIG. 3B. In such applications, an array of write wires is used. In FIG. 3B ferromagnetic collector electrode 350 of each element 300 of the array is fabricated in the vicinity of a pair of write wires, and the pair is unique for each element. Write wire 356, a segment of which is shown, is one member [I] of a column of [n] write wires, and write wire 358 is one member [j] of a row of [m] wires, with all n+m wires used to address each of the n*m elements of the [n] by [m] array. Each write wire 356 and 358 is connected to a bipolar current source at one end and ground at the other end, and the two wires are electrically isolated from each other by insulating layer 368 and from the ferromagnetic collector electrode by insulating layer 364.

The magnetic field at each ferromagnetic collector 352 of the array is the sum of the fields 362 and 360 generated from current in each wire 356 and 358. The current amplitude for the pulses simultaneously applied to each line and the inductive coupling parameter for each line are adjusted so that the net field H at each ferromagnetic collector 352 is slightly larger than the coercivity of the ferromagnetic collector. However, the field generated by either write line alone is less than the coercivity. Thus, appropriate current pulses of positive or negative polarity transmitted down the [I] and [j] write lines will orient the magnetization of the ferromagnetic collector of the element at the site with the address (i,j) to be positive or negative (up or down) but the magnetization orientation of the ferromagnetic collectors at other sites in row [I] or column [j] will not be affected.

Third Embodiment—Magnetic Spin Transistor Logic Gate

The following discussion explains the implementation of the magnetic spin transistor in digital operation as a logic gate. As an aid to understanding the present description, however, some simplifying conventions are useful.

Refer first to FIG. 3. When the ferromagnetic collector 14 has a coercivity $H_{C,1}$ and the write wire 36 is fabricated with unit inductive coupling strength, the write pulse amplitude necessary to orient $M_C$ is defined to be unitary. That is to say, when $I_W=1$ [arbitrary unit] in a write wire with coupling efficiency α=1, the generated magnetic field H at the position of the ferromagnetic collector is slightly [epsilon] larger than the coercivity, $H_{C,1}$, $H=H_1>H_{C,1}$.

Secondly, for this embodiment, the geometry of the spin transistor is chosen so that $R_B$ and $R_L$ have values that offset the output upwards by the amount $R_S$. As described above, the output of the device is then a positive current pulse (of amplitude 1) when $M_C$ is up [$M_E$ and $M_C$ parallel], and zero current (or voltage) when $M_C$ is down [$M_E$ and $M_C$ antiparallel].

Third, for this embodiment the amplitude of the bias current pulse [and $R_B$ and $R_L$ in typical circuits] is adjusted so that the output current amplitude $I_{OUT}$ is identical with that of the unit write pulse, $I_{OUT}=I_W=1$.

With these parameters the spin transistor becomes a two-state digital logic gate which has memory and which can perform Boolean logic. The state with $M_C$ up [$M_E$ and $M_C$ parallel] results in a HIGH, TRUE state with positive current (or voltage) output, and represents a binary value "1." Positive write input pulses of unit amplitude are also HIGH, TRUE states with the binary value "1." The state with $M_C$ down [$M_E$ and $M_C$ antiparallel] results in a LOW, FALSE state with zero current (or voltage) output, and represents the binary value "0," as does an input write pulse of zero amplitude.

Other variations of the above parameters can be used to configure the spin transistor as a logic gate element. For example, adding an offset of $R_S$ to the output is not necessary for operation of logic gates. If the output is symmetrically bipolar, operation as a logic gate could be accomplished by adding a diode to detector 32 such that positive output currents (or voltages) are transmitted and negative currents (voltages) are blocked. If $R_B$ and $R_S$ are chosen so that the output is offset negative by $R_S$, then the output of such a spin transistor can be used for inverted logic. In this way, a negative write pulse would be HIGH, TRUE or "1," and a zero amplitude write pulse would be LOW, FALSE or "0." Now, however, the state with $M_C$ up ($M_E$ and $M_C$) is LOW, FALSE or "0," and the state with $M_C$ down ($M_E$ and $M_C$ antiparallel) is HIGH, TRUE or "1;" the initial relative orientation of $M_E$ and $M_C$ should be parallel, rather than antiparallel also.

—Spin Transistor OR Logic Gate—

Operation of specific logical gates is depicted in FIGS. 4–8. In FIG. 4, the application of the present magnetic spin transistor as an OR logic gate is shown.

Figure 4A:
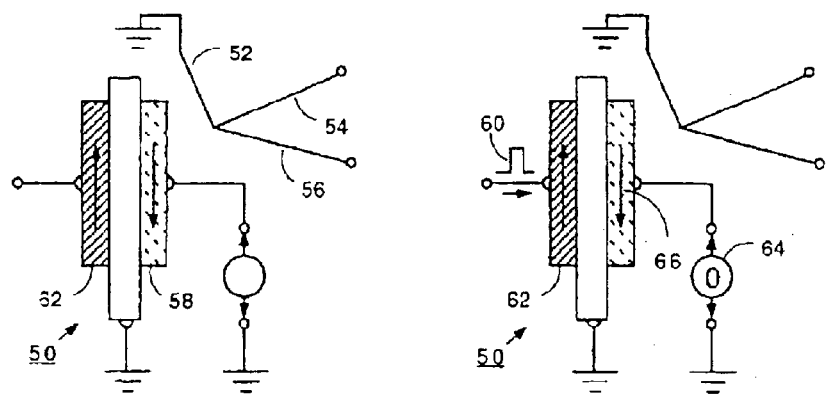
FIGS. 4A, 4B and 4C are schematic views of the present improved spin transistor operating as an OR gate.

In FIG. 4(a), a single write line 52 to spin transistor 50 has two input nodes 54 and 56 which can receive two synchronous current pulses as input. The ferromagnetic emitter 62 has more hash marks to signify that its coercivity is larger than the ferromagnetic emitter, and the orientation of its magnetization $M_E$ remains always in the initial, up position. The ferromagnetic collector 58 has fewer hash marks to signify that its coercivity is smaller than the coercivity of the ferromagnetic emitter, and the magnetization orientation $M_C$ is modifiable and can be set by the field generated by input current pulses.

When performing a logical gate operation, the spin transistor gate 50 undergoes the following three separate steps in time. At time (step) (I) (not depicted in the figure) spin transistor gate 50 is set to an initial condition by a current input pulse on wire 56; for an AND or an OR gate operation, $M_C$ is initially set to a down condition [$M_E$ and $M_C$ antiparallel]; whereas for a NOT, NAND or NOR gate, $M_C$ is initially set to an up condition [$M_E$ and $M_C$ parallel]. The spin transistor gate 50 is now capable of receiving data inputs, which occurs at a next time (step) (ii). Logical data (having binary values of 1 or 0) in the form of input write pulses are received on write wire 56. Depending on the magnitude of these pulses, they may affect (change) the magnetization orientation $M_C$ 66 of the ferromagnetic collector 58. At a later time (step) (iii) a bias pulse (i.e. a read pulse) 60 is applied to ferromagnetic emitter 62, and the current (or voltage) at the ferromagnetic collector 58 is sensed by the detector 64. Accordingly, the ferromagnetic collector magnetization may be read out as an output binary "1" or "0" corresponding to some Boolean logical combination of the data input signals.

In the specific embodiment of FIG. 4, the logical operation of a spin transistor as an OR gate is depicted in FIG. 4. In this embodiment, there are two separate data inputs 54 and 56, each of which can have a "1" or "0" input current value, for a total of four possible input write pulse configurations. As mentioned above, the ferromagnetic collector magnetization orientation is initially set to a down, or opposite state to the ferromagnetic emitter.

In FIG. 4(a), a first input combination of two write pulses of zero amplitude (logical data values of "0") on lines 54 and 56 is shown. The orientation $M_C$ of the ferromagnetic collector 66 remains unchanged from its initial condition because no field is generated by wire 56. Consequently, when a read pulse 60 is applied to the logic gate 50, a zero amplitude output 64 (logical "0") is detected.

Figure 4B:
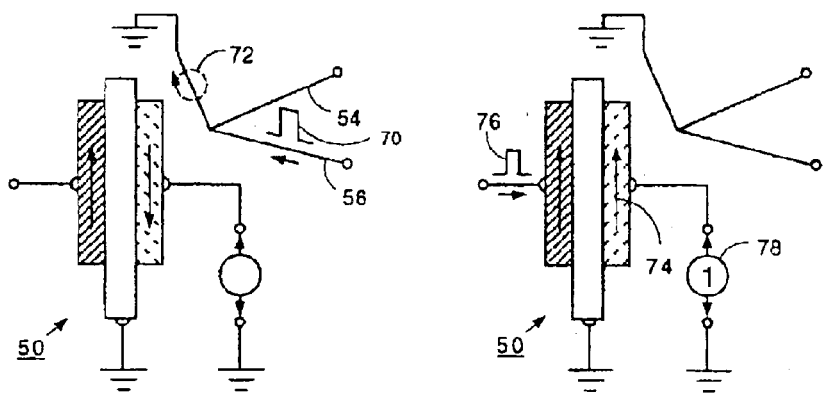

In FIG. 4(b), the second and third possible combinations of input states from wires 54 and 56 is shown. Here, a single write pulse of unit amplitude 70 [representing a logical "1" input data value] is applied to either input terminal 54 or 56. The localized field 72, is $H=H_{1>Hc,1}$; when applied to the ferromagnetic collector 58 this field is large enough to re-orient or re-set the magnetization $M_C$ 74 of the ferromagnetic collector 58 to an "up" condition so that when a read pulse 76 is applied to the gate 50, a positive output (logical "1") of unit amplitude 78 is generated.

Figure 4C:
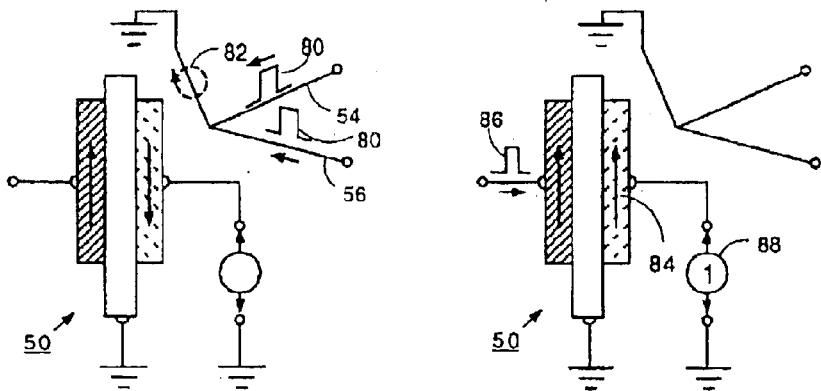

Finally, in the last possible combination of data input values, shown in FIG. 4(c), two write pulses 80 of a high amplitude [representing logical "1"s] are synchronously applied to the inputs 54 and 56. The field 82 at the ferromagnetic collector is now $H=2H_1>H_{c,1}$; this also causes $M_C$ to re-set or re-orient to a different (up) magnetization state 84. Consequently, when read pulse is applied to the gate 50, a positive output 88 [logical "1"] results.

As can be seen below, the truth table for this magnetic spin transistor logic gate 50 is identical with that of an OR gate.

TABLE 1

Truth Table for Spin Transistor Logic Gate of FIG. 4, an OR gate.

| Input (line 54) | Input Line 56 | Output |
|---|---|---|
| 0 | 0 | 0 |
| 0 | 1 | 1 |
| 1 | 0 | 1 |
| 1 | 1 | 1 |

—Spin Transistor AND Logic Gate—

In FIG. 5, the application of the present magnetic spin transistor as an AND logic gate is shown. The implementation of an AND gate can be accomplished by one of several ways using a magnetic spin transistor.

In a first configuration, an AND gate can be made by choosing the ferromagnetic collector such that its coercivity $H_{c,2}$ is twice as large as in the previous case, $H_{c,2}=2H_{c,1}$. This can be done by choosing a material with an intrinsically different coercivity or by introducing magnetic anisotropies such as using crystallographic, substrate, or exchange anisotropy.

In a second configuration, the same material with the same coercivity [as the OR gate] $H_{c,1}$ could be used but the inductive coupling parameter [between write wire and ferromagnetic collector] could be weakened, e.g. $\alpha=\frac{1}{2}$, so that the field generated at the ferromagnetic collector from a write pulse of amplitude $I_W=1=H_1/2$.

In a third configuration, the same material with the same coercivity as the OR gate could be used, but a smaller current amplitude (half as large as that used previously for the OR gate) could be used. In this configuration, a field large enough to overcome the coercivity $H_{c,1}$ (and thus re-set the magnetization orientation of the ferromagnetic collector to generate a high or "1" output) would only occur when both input write pulses (data values) were of a high amplitude.

The following discussion proceeds for the case where the coercivity has been altered to the value $H_{c,2}=2H_{c,1}$, but an analogous discussion would proceed for the case where the inductive coupling was diminished, or where the current for any particular input was reduced by ½.

The operation of a spin transistor logic AND gate 90 is depicted in FIG. 5. The ferromagnetic emitter 93 is heavily hashed, as in FIG. 4. The hashing of ferromagnetic collector 91 is darker than the ferromagnetic collector 58 of the OR gate depicted in FIG. 4, signifying that the coercivity of the ferromagnetic collector 91 for the AND gate is larger than that of the ferromagnetic collector 58 for the OR gate, $H_{c,2}=2H_{c,1}$.

As with the OR gate embodiment, there are two separate data inputs 92 and 94, each of which can have a "1" or "0" input current value, for a total of four possible input write pulse configurations or combinations. As mentioned above, the ferromagnetic collector magnetization orientation is initially set to a down, or opposite state to the ferromagnetic emitter.

Figure 5A:
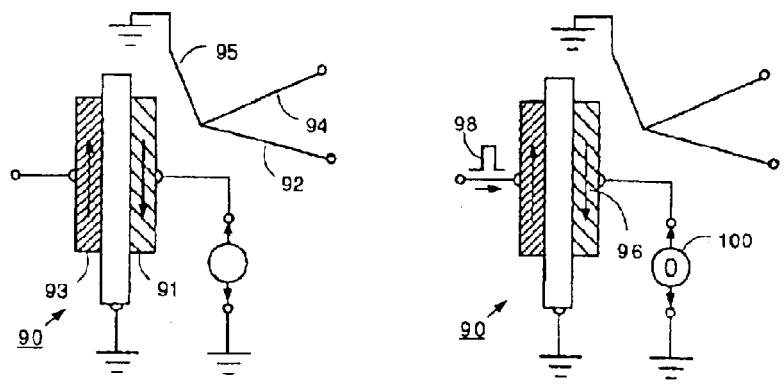
FIGS. 5A, 5B and 5C are schematic views of the present improved spin transistor operating as an AND gate.

In a first combination shown in FIG. 5(a), at step (ii) note above for the operation of a spin transistor as a logic gate, the input is two write pulses of zero amplitude (representing logic value "0") applied to write wires 92 and 94. The orientation state $M_C$ 96 of the ferromagnetic collector is unchanged from its initial (down) condition, so that (iii) a read pulse 98 applied to the spin transistor logic gate underbar results in zero amplitude (logic value "0") output 100.

Figure 5B:
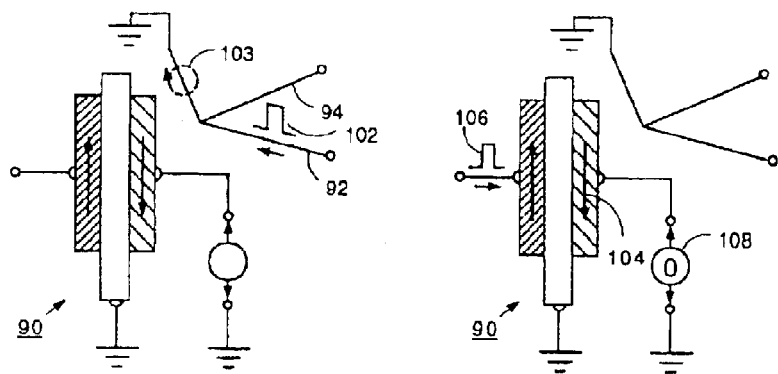

In FIG. 5(b), second and third combinations result when at step (ii) a single write pulse 102 of unit amplitude is applied to either input terminal 92 or 94. Because the coercivity of the ferromagnetic collector is twice as large as before [or because the coupling is half as strong, or because the current at 92/94 is half as much], the field $H=H_1<H_{c,2}$ is not sufficient to reorient the magnetization state $M_C$ 104 of the ferromagnetic collector, and (iii) a read pulse 106 applied to the gate 90 results in zero output (logical value "0") at 108.

Figure 5C:
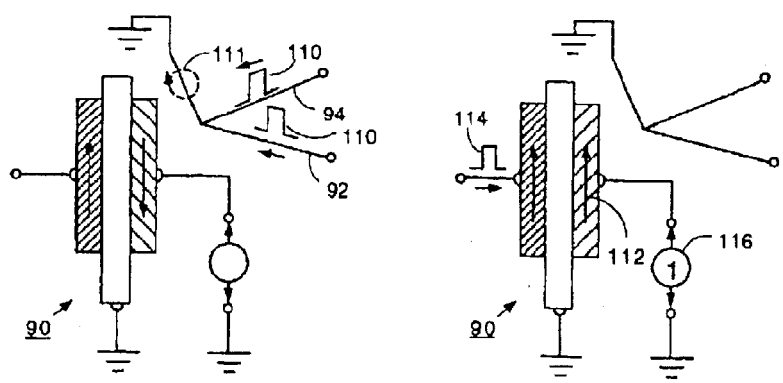

In the last combination shown in FIG. 5(c), (ii) two write pulses 110 of a high amplitude [logical "1"] are synchronously applied to the inputs 92 and 94. The field at the ferromagnetic collector is now $H=2H_1>H_{c,1}$, the orientation $M_C$ 112 of the ferromagnetic collector reverses (goes from down to up), and (iii) a read pulse 114 applied to the gate 90 results in a positive [logical "1"] output 116.

It can be seen therefore that the output of the spin transistor logic gate 90 is a logic value "1," only when both data input logic values are "1," as should be the case for any gate implementing Boolean AND logic. The truth table for this gate appears in Table 2, and is identical with that of an AND gate.

TABLE 2

Truth Table for Spin Transistor Logic Gate of FIG. 5, an AND gate.

| Input (line 92) | Input Line 94 | Output |
| --- | --- | --- |
| 0 | 0 | 0 |
| 0 | 1 | 0 |
| 1 | 0 | 0 |
| 1 | 1 | 1 |

—Spin Transistor NOT (Inverter) Logic Gate—

In FIG. 6, the application of the present magnetic spin transistor as an NOT (inverter) logic gate is shown. Operating the spin transistor as a NOT gate 120 can be accomplished by making simple modifications to the OR gate configuration, and is depicted in FIG. 6. The ferromagnetic collector is fabricated to have a coercivity $H_{c,1}$, and a write wire 126 with a single input node 128 is fabricated with geometrically reversed polarity so that the positions of input node and ground are interchanged.

In addition, the initialization step (I) for a spin transistor logic gate implementing a NOT logical function [and also the NOR and NAND functions] requires setting the device to a configuration which has the magnetizations of ferromagnetic emitter 124 and ferromagnetic collector 122 parallel.

For this gate embodiment, there is only a single data input line 128, which can have a "1" or "0" input current value, for a total of two possible input write pulse configurations or combinations. As mentioned above, the ferromagnetic collector magnetization orientation is initially set to an up, or identical state to the ferromagnetic emitter.

Figure 6A:
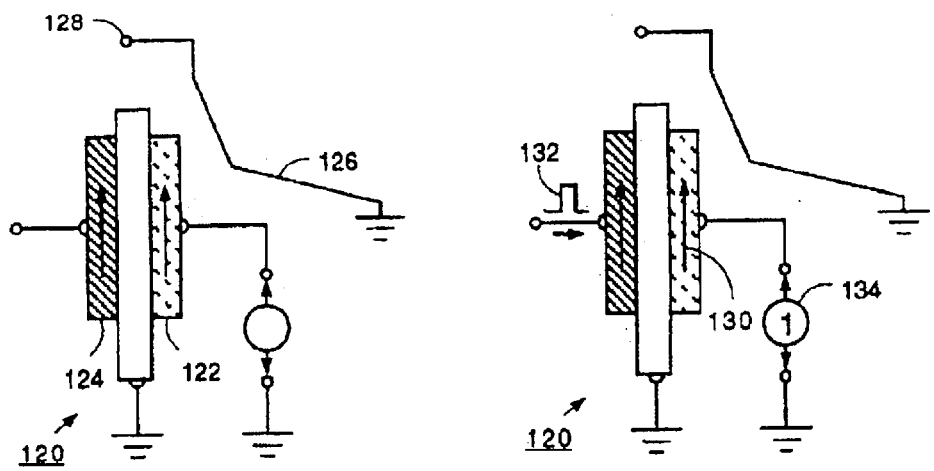
FIGS. 6A and 6B are schematic views of the present improved spin transistor operating as an NOT gate.

In a first combination shown in FIG. 6(a), at time (ii) a zero amplitude write pulse (logical value "0") is transmitted down the write wire 126. The orientation $M_C$ 130 of the ferromagnetic collector is not changed and therefore at time (iii), applying a read pulse 132 to the device 120 results in a positive (logical value "1") output 134.

Figure 6B:
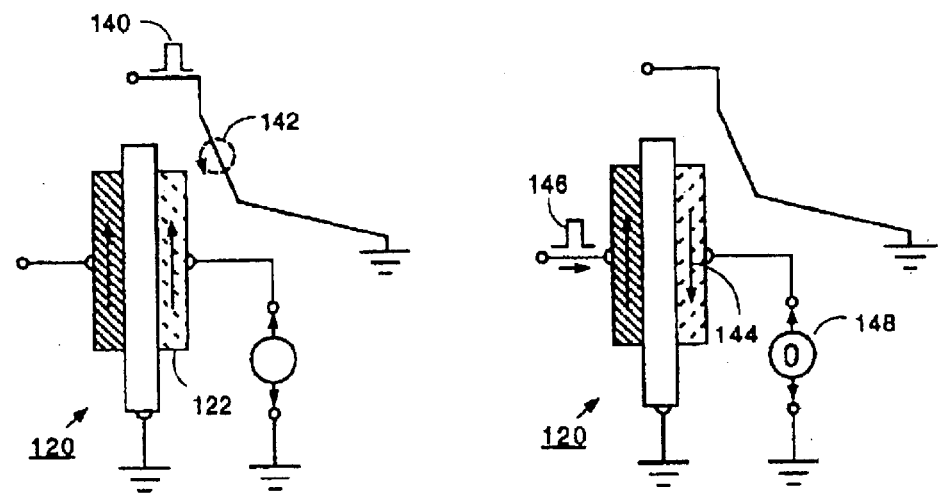

Similarly, in FIG. 6(b), when a (ii) single write pulse 140 (logical value "1") generates a field 142 $H=-H_0$ at the ferromagnetic collector 122 [the field here points down, in the opposite direction as for the OR and AND gates] this causes the magnetization orientation $M_C$ 144 of the ferromagnetic collector to reverse, pointing down so that $M_E$ and $M_C$ are now antiparallel. At time (iii), therefore, a read pulse 146 applied to the gate underbar 120 results in zero amplitude (logical value "0") output 148. The truth table for the device, presented in Table 3, is identical with that of a NOT gate.

TABLE 3

Truth Table for Spin Transistor Logic Gate of FIG. 6, a NOT gate.

| Input (line 128) | Output |
| --- | --- |
| 1 | 0 |
| 0 | 1 |

—Spin Transistor NOR Logic Gate—

In FIG. 7, the application of the present magnetic spin transistor as an NOR logic gate is shown. The operation of a NOR gate follows immediately from the description of the OR and NOT gates. The initial state of the device 160 at time (I) is set with the orientations $M_E$ and $M_C$ of ferromagnetic emitter 162 and ferromagnetic collector 164 parallel (both up). The inputs 166 and 168 and ground 170 of the write wire 172 are fabricated with the same orientation as for the NOT gate, i.e. the polarity is reversed from the sense in FIG. 4, and the coercivity $H_{c,1}$ and coupling efficiency a are chosen to be the same as the OR gate in FIG. 4. Thus, a positive write pulse (input data representing a logical "1") of amplitude $I_W=1$ is sufficient to generate a local magnetic field that will reverse the ferromagnetic collector magnetization orientation 164 and cause it to point down.

Similar to the OR and AND gate embodiments, there ate two separate data inputs 166 and 168, each of which can have a "1" or "0" input current value, for a total of four possible input write pulse configurations or combinations. As mentioned above, the ferromagnetic collector magnetization orientation is initially set to an up, or parallel state to the ferromagnetic emitter.

Figure 7A:
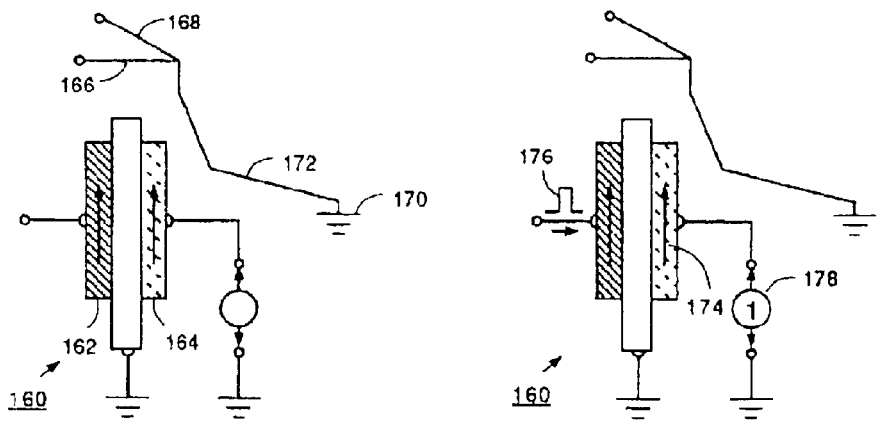
FIGS. 7A, 7B and 7C are schematic views of the present improved spin transistor operating as an NOR gate.

In a first combination shown in FIG. 7(a), at time (ii) noted above for the operation of a spin transistor as a logic gate, the input is two write pulses of zero amplitude (representing logic value "0") applied to write wires 166 and 168. The magnetization orientation $M_C$ 174 is unchanged, so that at time (iii) a read pulse 176 applied to the gate 160 results in positive (logical value "1") output of unit amplitude 178.

Figure 7B:
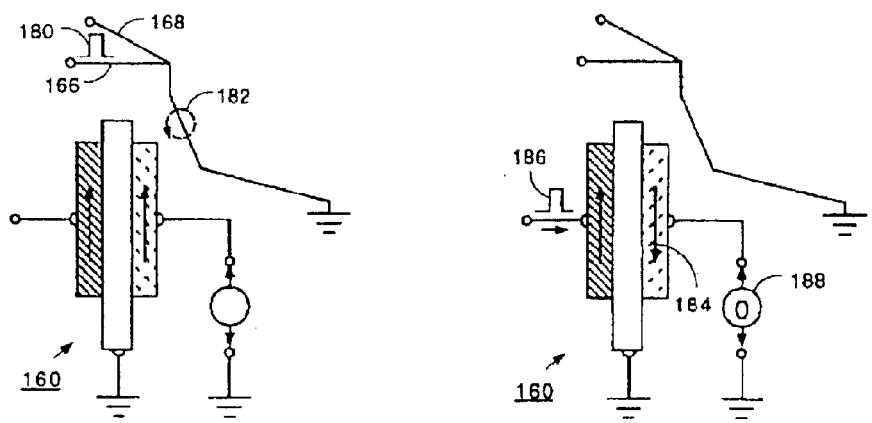

In the next two possible combinations of inputs shown in FIG. 7(b), at time (ii) a single write pulse of unit amplitude (logical value "1") 180 is applied to either input terminal 166 or 168. The field 182 $|H=H_1>H_{c,1}$ is sufficient to reset (reorient) the magnetization $M_C$ 184 so that at time (iii) a read pulse 186 applied to the gate 160 results in a zero amplitude (logical value "0") output 188.

Figure 7C:
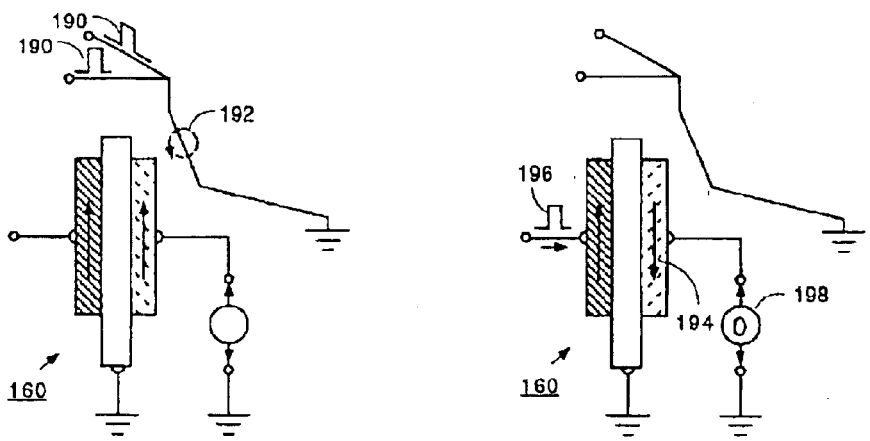

The last combination is shown in FIG. 7(c), where at time (ii) two write pulses 190 (logical value "1") are synchronously applied to the inputs. The field 192 at the ferromagnetic collector 164 is now $|H|=2H_1>H_{c,1}$, $M_C$ reorients to point down 194, and at time (iii) a read pulse 196 applied to the gate underbar 160 results in zero (logical "0") output 198. The truth table for this gate is presented in Table 4, and is identical with that of a NOR gate.

TABLE 4

Truth Table for Spin Transistor Logic Gate of FIG. 7, a NOR gate.

| Input (line 166) | Input Line (168) | Output |
|---|---|---|
| 0 | 0 | 1 |
| 0 | 1 | 0 |
| 1 | 0 | 0 |
| 1 | 1 | 0 |

—Spin Transistor NAND Logic Gate—

In FIG. 8, the application of the present magnetic spin transistor as an NAND logic gate 210 is shown. The operation of a NAND gate follows immediately from the description of the other gates above. In FIG. 8 ferromagnetic collector 214 has been marked with fewer hash marks than ferromagnetic emitter 212 and more hash marks than the ferromagnetic collector of the NOR gate 160 to signify that its coercivity [as in the case of the AND gate] is $H_{c,2}>H_{c,1}$, and that its coercivity is less than that of the ferromagnetic emitter 212. In other possible configurations, as discussed above for the AND gate, a weaker coupling, $\alpha=\frac{1}{2}$, could be chosen by placing the write wire further away from the ferromagnetic collector, for example. Alternatively reduced current write inputs for the data inputs on lines 230 and 232 could be used.

As with the other gates discussed above, there are two separate data inputs 230 and 232, each of which can have a "1" or "0" input current value, for a total of four possible input write pulse configurations or combinations. In the NAND gate configuration, the ferromagnetic collector magnetization orientation of the spin transistor is initially set to an up, or parallel state to the ferromagnetic emitter.

Figure 8A:
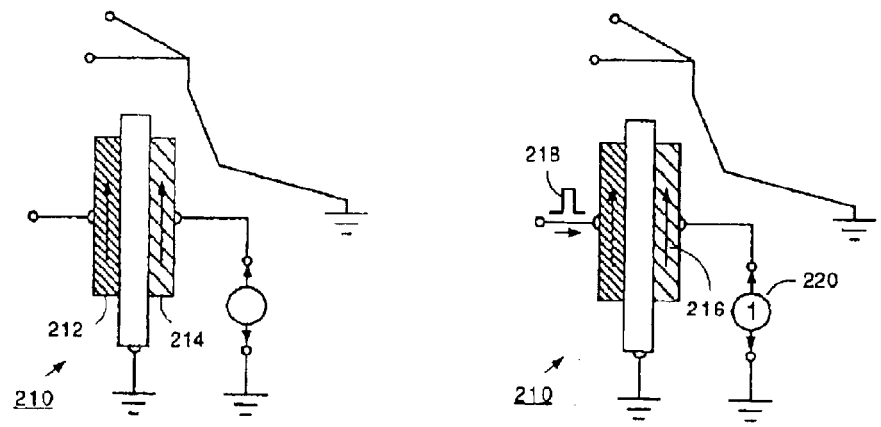
FIGS. 8A, 8B and 8C are schematic views of the present improved spin transistor operating as an NAND gate.

In a first combination shown in FIG. 8(a), at time (ii) noted above for the operation of a spin transistor as a logic gate, the input is two write pulses of zero amplitude (representing logic value "0") applied to write wires 230 and 232. The magnetization orientation $M_C$ 174 is unchanged, so that at time (iii) a read pulse 218 applied to the gate 210 results in positive (logical value "1") output of unit amplitude 220.

Figure 8B:
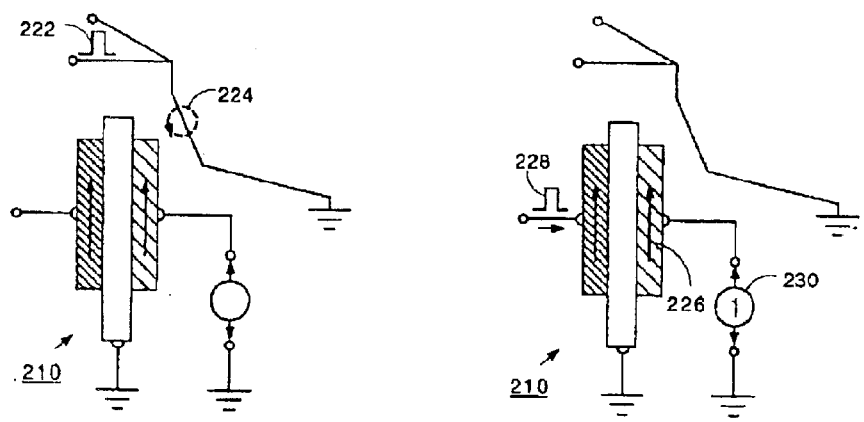

In the combinations shown in FIG. 8(b), (ii) a single write pulse of unit amplitude 222 (logical data value "1") is applied to either input terminal. Because the coercivity is twice as large as before, the field 224 $|H|=H_1<H_{c,2}$ is not sufficient to reorient the magnetization orientation $M_C$ 226, and consequently at time (iii) a read pulse 228 applied to the gate 210 results in positive (logical data value "1") output 230.

Figure 8C:
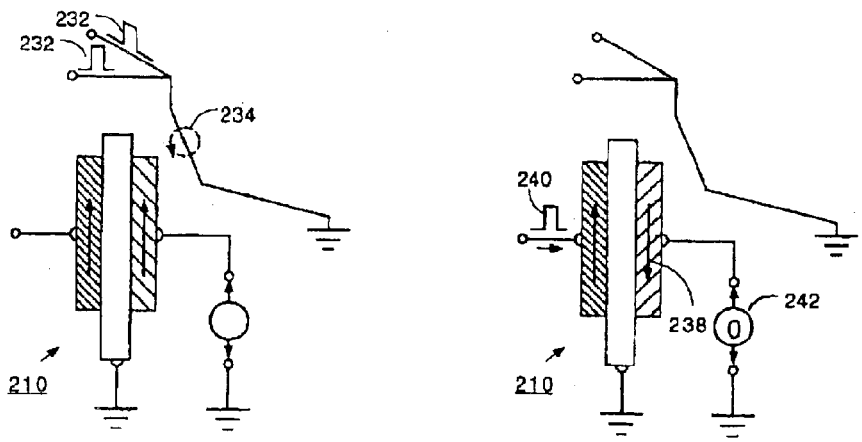

Finally, in the last combination shown in FIG. 8(c), (ii) two write pulses 232 (representing logic value "1") are synchronously applied to the inputs. The field 234 at the ferromagnetic collector is now $|H|=2H_1>H_{c,2}$, $M_C$ becomes reoriented to a down state 238, and at time (iii) a read pulse 240 applied to the gate 210 results in zero (logical value "0") output 242. The truth table for this gate is presented in Table 5, and is identical with that of a NAND gate.

TABLE 5

Truth Table for Spin Transistor Logic Gate of FIG. 8, a NAND gate.

| Input (line 230) | Input Line (232) | Output |
|---|---|---|
| 0 | 0 | 1 |
| 0 | 1 | 1 |
| 1 | 0 | 1 |
| 1 | 1 | 0 |

—Dynamically Programmable Spin Transistor Logic Gate—

While different coercivities were used to implement some of the specific logic gate embodiments described above (the AND and NAND logic gates), it is possible, as explained briefly before, to use a single spin transistor physical structure to implement all of the aforementioned logic gates. In such an approach, the only parameter needed to create a particular type of logic gate is to adjust or program the value of the write current, $I_W$ used to input data to the device.

Looking at FIG. 3, for example, when $I_W=1$, the spin transistor operates as an OR gate; if $I_W=\frac{1}{2}$, the spin transistor operates as an AND gate; if $I_W=-\frac{1}{2}$, the spin transistor operates as an NAND gate; when $I_W=-1$, the spin transistor operates as a NOT or NOR gate. Thus, the logical function performed by the spin transistor can be varied simply by changing the value of the input current (and thus magnetic field) coupled to the device.

Alternatively, another possibility which may be attractive under certain circumstances is to have a selectable set of write wires so that the coupling to the spin transistor could be varied to configure the device as different logical elements.

The advantage of the above invention is that a single spin transistor not only operates as a logic gate, it can also be dynamically reprogrammed merely using a different input current value to perform a different function as needed or desired by the particular application environment.

Fourth Embodiment—Magnetic Spin Transistor With Gain & Coupling Capability for Creating Spin Transistor Gate Circuits Whereas high impedance semiconductor gates operate with voltage pulses and multiple gates are linked together electrodynamically, spin transistor gates operate with current pulses. Until the present invention, there has been no mechanism for linking magnetic spin transistors.

Figure 10:
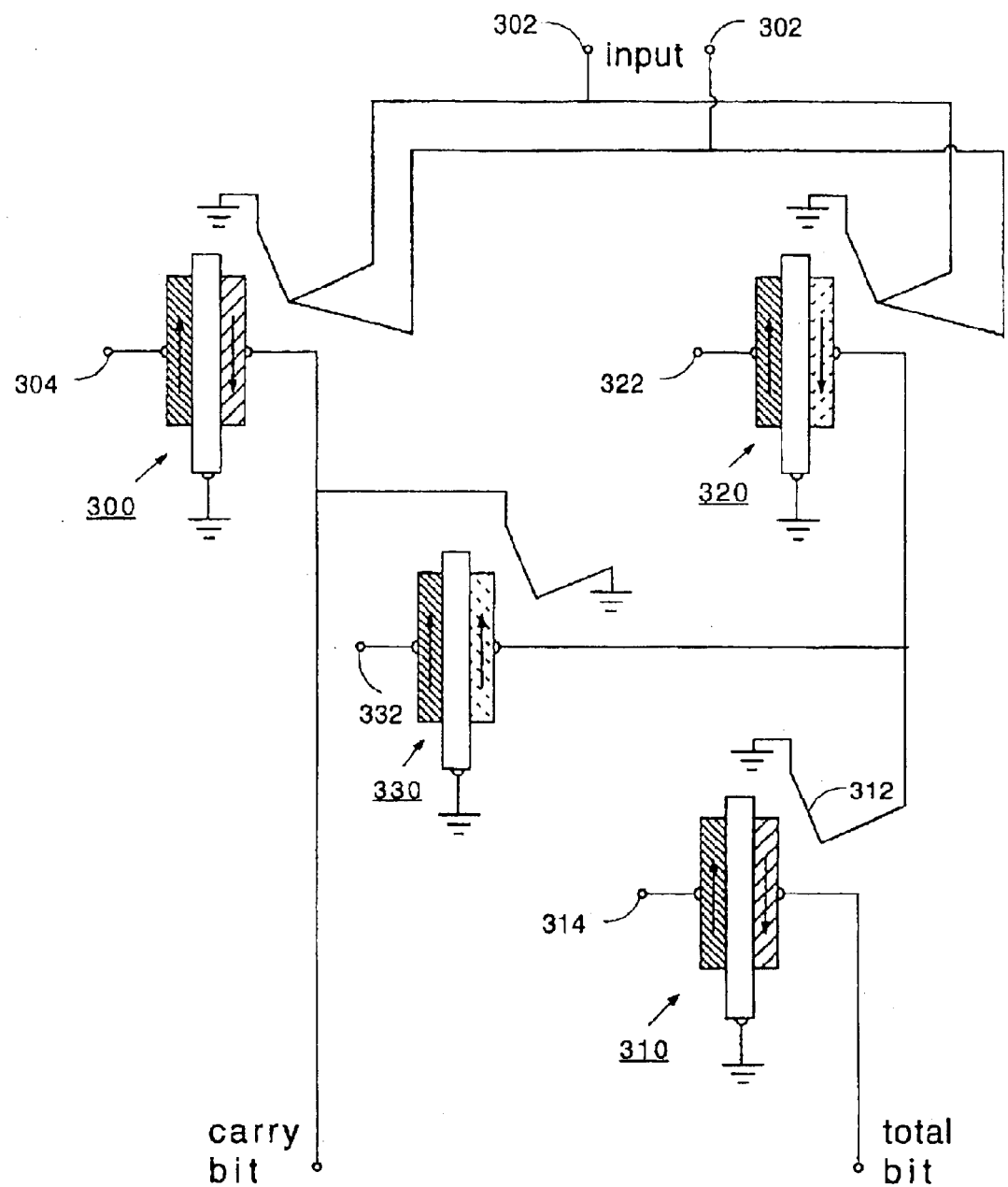
FIG. 10 is a schematic view of one embodiment of the present invention wherein a system of spin transistor gates can operate to perform the task of a half adder.

The present invention uses inductive coupling to link spin transistors. As seen in FIG. 10, an output line from the ferromagnetic collector of one magnetic spin transistor can generate an output which is used as the input write line of a second gate. Using this mechanism, multiple gates can be linked together to process complex Boolean operations.

In order to inductively couple one spin transistor to another, however, it is necessary that the magnitude of the output current of any transistor be made equal to (or greater than) the amplitude of a write pulse, $I_{OUT}>=I_W$; this is the same as demanding that the fanout of a device must be greater than one, i.e. that one device must be capable of setting the state a second device. The present invention, achieves this desired goal of obtaining a current gain, i.e., $I_{OUT}>=I_W$.

The magnitude of $I_{out}$ is determined by the transimpedance $R_S$ and the parasitic and load resistances $R_B$ and $R_L$. Since it is also proportional to the bias current it can always be made larger by increasing the amplitude $I_R$. However, a significant problem results in prior art spin transistors when $I_{OUT}$ is made to be comparable in magnitude to $I_W$: a stray magnetic field from $I_{OUT}$ is large enough alter the magnetization orientation of the ferromagnetic collector. If this occurs, the device becomes unreliable and unstable.

The present invention solves this instability and achieves a fanout larger than 1 by configuring the geometry of the ferromagnetic collector so as to take advantage of certain intrinsic anisotropic properties of ferromagnetic films.

It is well known that thin ferromagnetic films have a large, geometric anisotropy that is typically large enough to confine the magnetization orientation to the plane of the film. In addition, most ferromagnetic films have one or more anisotropy axes in the film plane. An axis along which the anisotropy energy of the film is small is known as an easy magnetization axis, and the two orientations (positive or negative, parallel or antiparallel) along this axis are preferred orientations of the magnetization. Similarly, a direction along which the anisotropy energy is large is a hard magnetization direction and is not a preferred orientation for the magnetization. Quantitatively, the coercivity along an easy axis is smaller than that along a hard axis.

Several factors contribute to the anisotropy energy of a thin ferromagnetic film, including shape anisotropy [i.e. different aspect ratios of thickness to length and width], interactions with the substrate and, for single crystal films, crystallographic orientation. Polycrystalline films deposited with an external field present at the substrate can also have significant anisotropies because the field orients the small evaporant particles so that there is microscopic crystallographic anisotropy. Substrates with, for example, parallel microgrooves can induce significant anisotropies in a ferromagnetic film. Buffer layers can induce similar effects. For example, a film of an antiferromagnetic material can induce a strong anisotropy in an overlaid ferromagnetic film, and the direction and strength of the anisotropy depends on the precise thickness (and stoichiometry) of the antiferromagnetic material.

Using these methods, or combinations of these methods, anisotropies can be induced in any material such that the ratio of the coercivity along the easy axis to that along the hard axis can be of order 10 to 1 (e.g. 100 Oe to 10 Oe). By contrast, a polycrystalline ferromagnetic film patterned as a thin disk on a neutral substrate would have isotropic magnetization in the film plane.

Figure 9A:
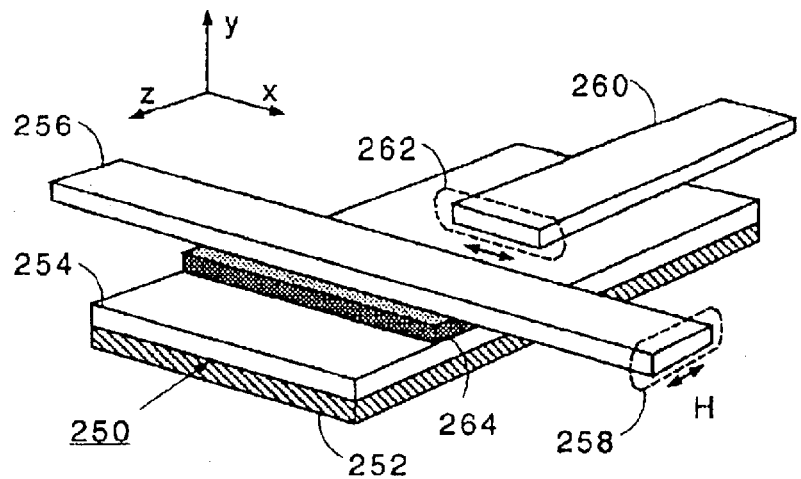
FIGS. 9A, 9B and 9C are perspective views of various fabrication geometries used in the present invention for write wires and output leads which allow the present device to be connected to other spin transistor devices, and to operate with current gain.

In the discussion that follows, the means for producing the anisotropy is unimportant; and it is assumed that some standard technique known in the art has produced a ferromagnetic collector that is magnetically anisotropic. Ferromagnetic collector geometries which take advantage of this magnetic anisotropy and thus avoid the instability associated with large output currents are schematically depicted in FIG. 9. A ferromagnetic collector electrode 250 lying in the x-z plane is typically a metal bilayer composed of a ferromagnetic film 252 covered by a thin nonmagnetic film 254 which protects the former from oxidation and promotes uniform current flow. As discussed above, there is a large anisotropy energy in the ferromagnetic film in the y direction, and the magnetization in constrained to lie in the x-z plane. In FIG. 9(a), ferromagnetic collector electrode 250 is fabricated with an easy axis along z, and the write wire 256 [or pair of wires] is electrically isolated from the ferromagnetic collector electrode by an insulating layer 264 and is oriented parallel to x so that any field 258 generated by a write pulse at the position of the ferromagnetic collector 252 points along the axis. This field is used to orient the ferromagnetic collector magnetization $M_C$ along the +/−z axis. The ferromagnetic collector is also fabricated with a hard magnetization axis along x, and the output line 260 from the spin transistor is chosen to run along z. The field 262 generated by the output current at the position of the ferromagnetic collector therefore points along the x axis. Since x is a hard magnetization direction, it takes much larger fields, and therefore much larger output currents, to reorient $M_C$ in this direction.

Thus, the output current that can be sent through the output wire without causing a reorientation of $M_C$ can be much larger than the write current, or in other words, $I_{OUT} \gg I_W$. In this way the condition necessary for fanout to be greater than one is satisfied, and inductive coupling between two spin transistors can be accomplished.

Figure 9B:
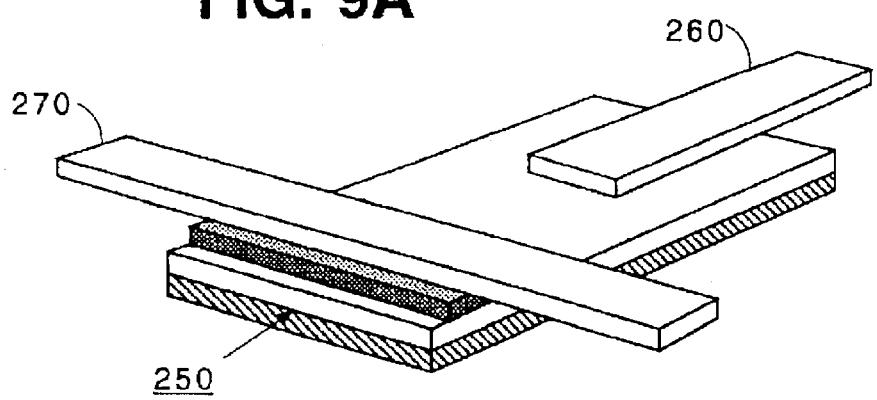
Figure 9C:
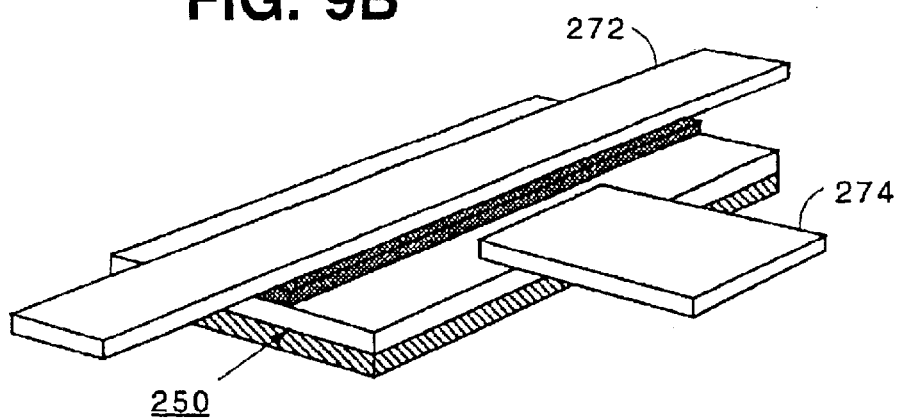

Any number of collector geometries, only three of which are shown in FIGS. 9(a) to 9(c) are satisfactory for making certain that $M_C$ is not re-oriented by a large output current. For example, it is not necessary that the write wire be centered over the ferromagnetic collector as depicted in FIG. 9(b). Applying a coercive field by sending current through a write wire 270 at or near an edge of the ferromagnetic film can be adequate to orient the magnetization of the entire film. Also, the particular choice of easy and hard axis is not important. If the easy axis is along x, the write wire 272 [or pair of wires] can be chosen to be parallel to z and the output line 274 to be parallel to x, as shown in FIG. 9(c). The only general considerations that need to be kept in mind is the fact that the write line should be chosen to be oriented perpendicular to the easy magnetization axis and the output line perpendicular to the hard magnetization axis.

Using this form of inductive coupling, multiple spin transistors, and spin transistor gates can be linked together to perform the processing operations of Boolean algebra. One combination of gates that operates as a half adder is depicted in FIG. 10; as is readily apparent to skilled artisans, any of a number of other combinations can be made, e.g. using NOR and NAND gates. Using the conventions of FIGS. 4–8, the ferromagnetic emitter of each gate has more extensive hash marking to signify a very large coercivity, and to denote that the magnetization $M_E$ never changes from up. Spin transistor AND logic gates 300 and 310 have ferromagnetic collectors with medium hash marking, denoting a coercivity larger than that of the ferromagnetic collector of the spin transistor OR logic gate 320 and spin transistor NOT logic gate 330, [or equivalently to denote a weaker coupling a of the write wire] which are hashed lightly.

After initializing the states of the gates, the operation of binary addition can proceed as follows. (1) Write pulses of zero or unit amplitude are simultaneously applied from the two input nodes 302 to the top spin transistor AND logic gate 300 and OR 320 gates. (2) A read pulse is applied to the input 304 of the AND gate 300, with the output of the operation setting the state of the NOT gate 330. (3) Read pulses are simultaneously applied to the inputs 332 and 322 of the NOT 330 and OR 320 gates, and the output of the two gates is input to the write wire 312 of the lower AND gate 310 thus setting its state. (4) The operation is now complete, with the "carry bit" stored in the state of the AND gate 300 and the "total bit" stored in the state of the AND gate 310.

The data is retained in this state, and at any later time the result can be read out by applying read pulses to the inputs 304 and 314 of the two AND gates 300 and 310. A half adder is a fundamental building block of all logical processing operations, and it will be apparent to persons skilled in the art from the present invention that other such building blocks can easily be assembled from magnetic spin transistors of the type described herein. Using half adders, OR, AND, NOT, NOR and NAND gates, all the usual mathematical and processing operations associated with a microprocessor can be performed.

Accordingly it is believed that the present invention provides all the necessary information required to design and construct a typical microprocessor using magnetic spin transistor gates.

Although the present invention has been described in terms of a preferred embodiment, it will be apparent to those skilled in the art that many alterations and modifications may be made to such embodiments without departing from the teachings of the present invention. For example, it is apparent that other types of logical gate elements beyond those illustrated in the foregoing detailed description can be formed using the improved spin transistors of the present invention. Accordingly, it is intended that the all such alterations and modifications be included within the scope and spirit of the invention as defined by the following claims.

What is claimed is:

1. A magnetic spin device comprising:

a first ferromagnetic layer which has a changeable magnetization state;

a second ferromagnetic layer with a fixed magnetization state;

wherein the magnetic spin device has a spin resistance which is dependent on a relationship between said first ferromagnetic layer and said second ferromagnetic layer, including whether said changeable magnetization state and said fixed magnetization state are parallel or antiparallel;

a write line for receiving a write signal adapted for altering said changeable magnetization state, said write signal having a first variable amplitude including a first current value and a second larger current value than said first current value for setting the magnetic spin device to a first logic state, and a second variable amplitude including a third current value and a fourth larger current value than said third current value for setting the magnetic spin device to a second logic state.

2. The magnetic spin device of claim 1, wherein said magnetic spin device includes a magnetic spin transistor.

3. The magnetic spin device of claim 2, wherein said magnetic spin transistor includes a collector forming part of said first ferromagnetic layer, and an emitter forming part of said second ferromagnetic layer.

4. The magnetic spin device of claim 2, wherein said magnetic transistor is comprised entirely of a metal.

5. The magnetic spin device of claim 1, further including a low transmission barrier situated between said first ferromagnetic layer and said second ferromagnetic layer.

6. The magnetic spin device of claim 1, wherein said write line includes a plurality of selectable write wires, such that a first write wire is used for write signals having said first current value, and both a first write wire and a second write wire are used for write signals having said second larger current value.

7. The magnetic spin device of claim 1, wherein said write line carries currents having a single polarity.

8. The magnetic spin device of claim 1, wherein said write line is situated above said first ferromagnetic layer and is separated by an insulator layer from said first ferromagnetic layer.

9. A magnetic spin device comprising:

a first ferromagnetic layer which has a changeable magnetization state;

a second ferromagnetic layer with a fixed magnetization state;

wherein the magnetic spin device has a non-volatile logic state which is dependent on a relationship between said first ferromagnetic layer and said second ferromagnetic layer, including whether said changeable magnetization state and said fixed magnetization state are parallel or antiparallel;

a write line for receiving a write signal adapted for altering said changeable magnetization state;

wherein inductive coupling between said write line and said first ferromagnetic layer can be varied during operation of the magnetic spin device so that a magnitude of a magnetic write field associated with said write signal also can be varied.

10. The magnetic spin device of claim 9 wherein said inductive coupling is varied by using a first write wire and/or a second write wire for carrying said write signal.

11. The magnetic spin device of claim 9 wherein said magnitude of said magnetic write field is varied by a factor of two.

12. A magnetic spin device comprising:

a first ferromagnetic layer which has a changeable magnetization state;

a second ferromagnetic layer with a fixed magnetization state;

wherein the magnetic spin device has a logic state which is dependent on a relationship between said first ferromagnetic layer and said second ferromagnetic layer, including whether said changeable magnetization state and said fixed magnetization state are parallel or antiparallel;

a write line for receiving a write signal adapted for altering said changeable magnetization state, said write line including at least two write wires;

wherein during a first mode of operation, said logic state can be changed to either a first value or a second value in response to a first combination of write signals present on said at least two write wires;

and wherein during a second mode of operation, said logic state can be changed to said first value and/or said second value in response to a second combination of write signals present on said at least two write wires, said second combination of write signals being different from said first combination of write signals.

13. The magnetic spin device of claim 12 wherein an AND, NAND, NOT or NOR boolean function is implemented by the magnetic spin device during the first mode operation, and a different Boolean function is implemented during the second mode of operation.

14. The magnetic spin device of claim 12 wherein either of said first mode of operation or said second mode of operation can be dynamically implemented by the device.

15. The magnetic spin device of claim 12 wherein said first combination of write signals generates a first magnetic field, and said second combination of write signals generates a second magnetic field which is larger than said first magnetic field.

16. The magnetic spin device of claim 12, wherein said first ferromagnetic layer and said second ferromagnetic layer have in-plane anisotropies.

17. The magnetic spin device of claim 16, wherein said changeable magnetization state and said fixed magnetization state are constrained to lie in said plane.

18. The magnetic spin device of claim 12, further including a read line which is separate from said write line.

19. The magnetic spin device of claim 18, wherein said read line is perpendicular to said write line.

20. The magnetic spin device of 12, wherein the device can be initialized to said first mode of operation or said second mode of operation.

* * * * *